(12) United States Patent
Charbonnier et al.

(10) Patent No.: US 12,745,657 B2
(45) Date of Patent: Sep. 22, 2026

(54) INTEGRATION STRUCTURE FOR CONNECTING A PLURALITY OF SEMICONDUCTOR DEVICES, ASSOCIATED METHODS, ASSEMBLY AND SYSTEM

(71) Applicant: COMMISSARIAT A L'ENERGIE ATOMIQUE ET AUX ENERGIES ALTERNATIVES, Paris (FR)

(72) Inventors: Jean Charbonnier, Grenoble Cedex (FR); Edouard Deschaseaux, Grenoble Cedex (FR); Candice Thomas, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 880 days.

(21) Appl. No.: 18/070,996

(22) Filed: Nov. 29, 2022

(65) Prior Publication Data

US 2023/0170305 A1 Jun. 1, 2023

(30) Foreign Application Priority Data

Nov. 30, 2021 (FR) ...................................... 2112738

(51) Int. Cl.
*H10W 70/60* (2026.01)
*H10W 70/05* (2026.01)
(Continued)

(52) U.S. Cl.
CPC ........... *H10W 70/65* (2026.01); *H10W 70/05* (2026.01); *H10W 70/095* (2026.01);
(Continued)

(58) Field of Classification Search
CPC ... H10W 70/65; H10W 70/05; H10W 70/095; H10W 70/611; H10W 70/635;
(Continued)

(56) References Cited

U.S. PATENT DOCUMENTS 10,651,362 B2 * 5/2020 Rouse ................ H10N 60/0688
11,569,428 B2 * 1/2023 Roberts .................. G06N 10/40
(Continued)

FOREIGN PATENT DOCUMENTS

JP 2023503932 A * 2/2023 ........ H10W 20/4432
WO WO 2017/015432 A1 1/2017
(Continued)

OTHER PUBLICATIONS

Machine translation of JP-2023503932-A (Year: 2023).*
(Continued)

*Primary Examiner* — Eliseo Ramos Feliciano
*Assistant Examiner* — Thaddeus J Kolb
(74) *Attorney, Agent, or Firm* — CUSHMAN PARTNERS, LLC

(57) ABSTRACT

An integration structure for connecting a plurality of semiconductor devices, includes a substrate, a first face and a second face for receiving the semiconductor devices. At the first surface, at least one routing level includes at least one non-superconducting conductive routing track of a conductive material; and at least one superconducting routing track of a superconducting material. At the second surface, at least one routing level includes at least one non-superconducting conductive routing track of a conductive material; and at least one superconducting routing track of a superconducting material. The integration structure includes at least one non-superconducting conductive via connecting a non-superconducting conductive routing track of the first face to a non-superconducting conductive track of the second face and/or at least one superconducting via connecting a superconducting routing track of the first face to a superconducting track of the second face.

15 Claims, 21 Drawing Sheets

(51) Int. Cl.

*H10W 70/63* (2026.01)
*H10W 70/65* (2026.01)
*H10W 70/685* (2026.01)
*H10W 90/00* (2026.01)

(52) U.S. Cl.

CPC ........ *H10W 70/611* (2026.01); *H10W 70/635* (2026.01); *H10W 70/685* (2026.01); *H10W 90/00* (2026.01)

(58) Field of Classification Search

CPC .... H10W 70/685; H10W 90/00; G06N 10/40; H01L 23/49838; H01L 23/147; H01L 23/49827; H01L 23/49888; H10N 60/01; H10N 69/00

See application file for complete search history.

(56) References Cited

U.S. PATENT DOCUMENTS

| | | | | |
|---|---|---|---|---|
| 11,600,588 | B1 * | 3/2023 | Yao | G06N 10/00 |
| 2018/0013052 | A1 | 1/2018 | Oliver et al. | |
| 2018/0138389 | A1 * | 5/2018 | Kirby | H10N 60/0912 |
| 2019/0273197 | A1 | 9/2019 | Roberts et al. | |
| 2021/0167271 | A1 * | 6/2021 | Hidaka | H10N 60/10 |
| 2022/0012617 | A1 * | 1/2022 | Hassel | G06N 10/20 |
| 2022/0199507 | A1 * | 6/2022 | Abraham | G06N 10/40 |
| 2022/0344240 | A1 * | 10/2022 | Lee | H10W 40/255 |

FOREIGN PATENT DOCUMENTS

| | | | | |
|---|---|---|---|---|
| WO | WO-2017105524 A1 * | 6/2017 | | H10W 90/701 |
| WO | WO-2018052399 A1 * | 3/2018 | | H10W 72/072 |

OTHER PUBLICATIONS

Search Report as issued in French Patent Application No. FR2112738, dated Aug. 8, 2022.

Yost, D. R. W., et al., "Solid-state qubits integrated with superconducting through-silicon vias," ARXIV.org, Cornell University Library, Sep. 2020, XP081773175, 9 pages.

Mallek, J. L., et al., "Fabrication of superconducting through-silicon vias," ARXIV.org, Cornell University Library, Mar. 2021, 14 pages.

Rosenberg, D., et al., "Solid-State Qubits," IEEE Microwave Magazine, Aug. 2020, pp. 72-85.

Alfaro-Barrantes, J. A., et al., "Superconducting High-Aspect Ratio Through-Silicon Vias With DC-Sputtered Al for Quantum 3D Integration," IEEE Electron Device Letters, vol. 41, No. 7, Jul. 2020, pp. 1114-1117.

Vahidpour, M., et al., "Superconducting Through-Silicon Vias for Quantum Integrated Circuits," ARXIV.org, Cornell University Library, Aug. 2017, 5 pages.

|Grigoras, K., et al., "Superconducting TiN through-silicon-vias for quantum technology," 2019 21st Electronics Packaging Technology Conference, (Year: 2019), pp. 81-82.

* cited by examiner

[Fig. 1]
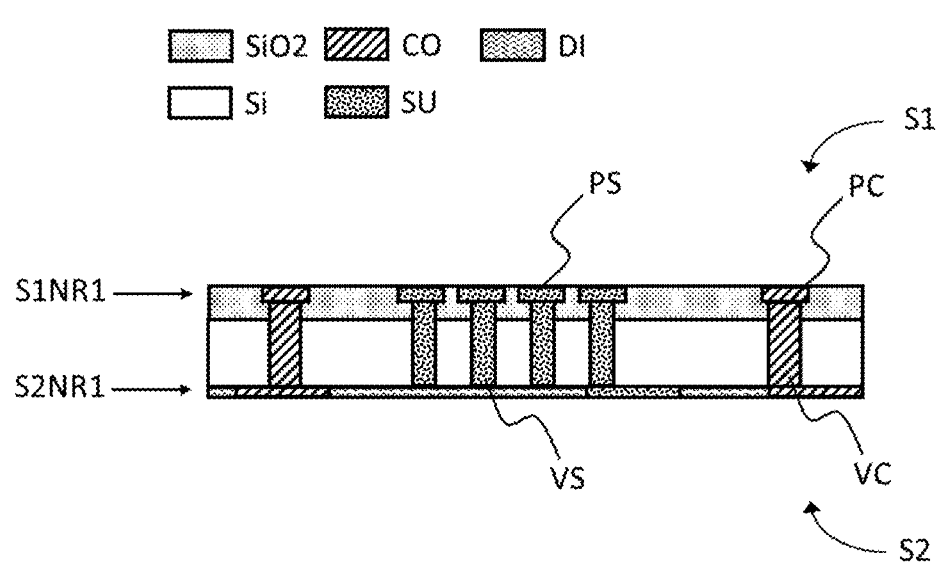
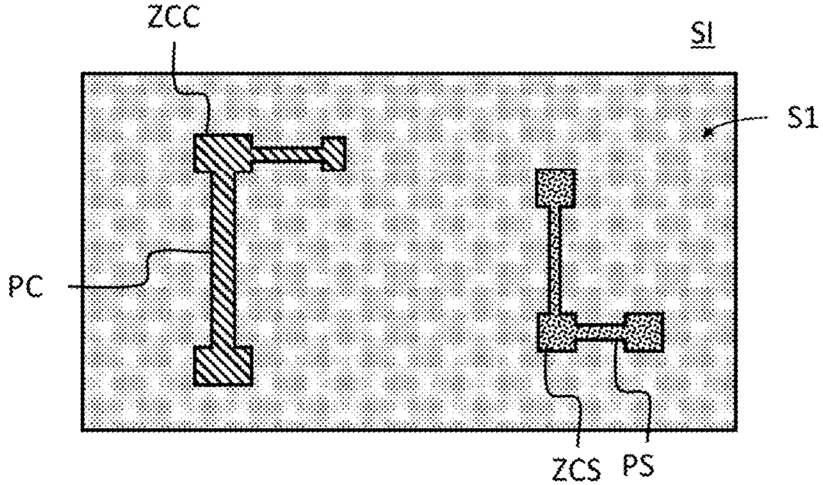

[Fig. 2]
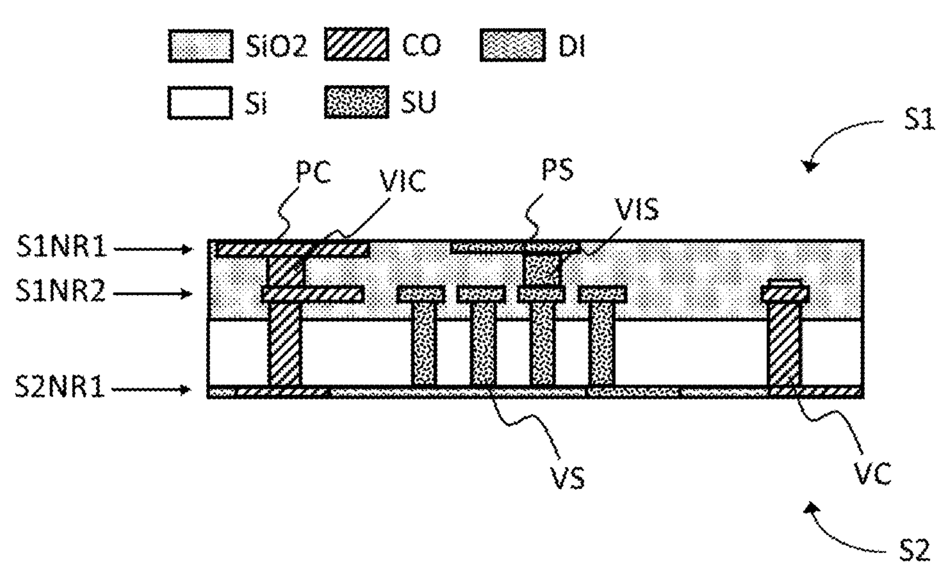
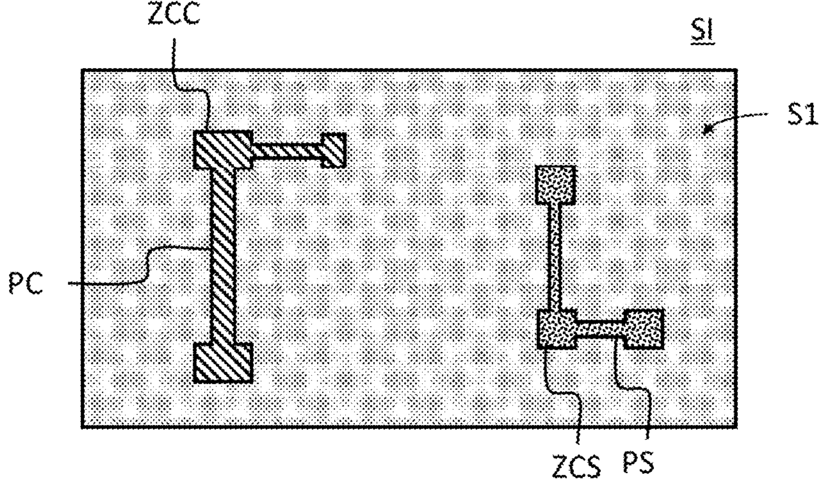

[Fig. 3A]
[Fig. 3B]

[Fig. 3C]
SiO2 CO
Si
S1
VC
S2
Cu Ti
TiN
[Fig. 3D]
SiO2 CO
Si
S1
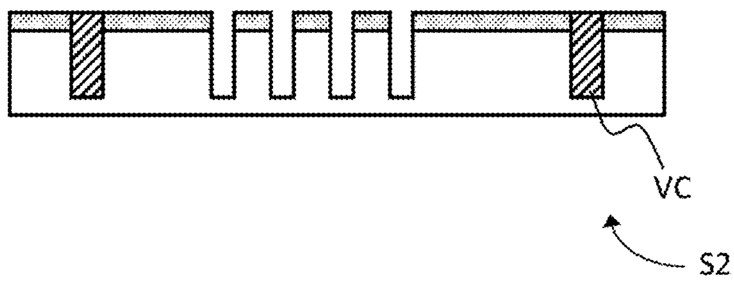

[Fig. 3E]
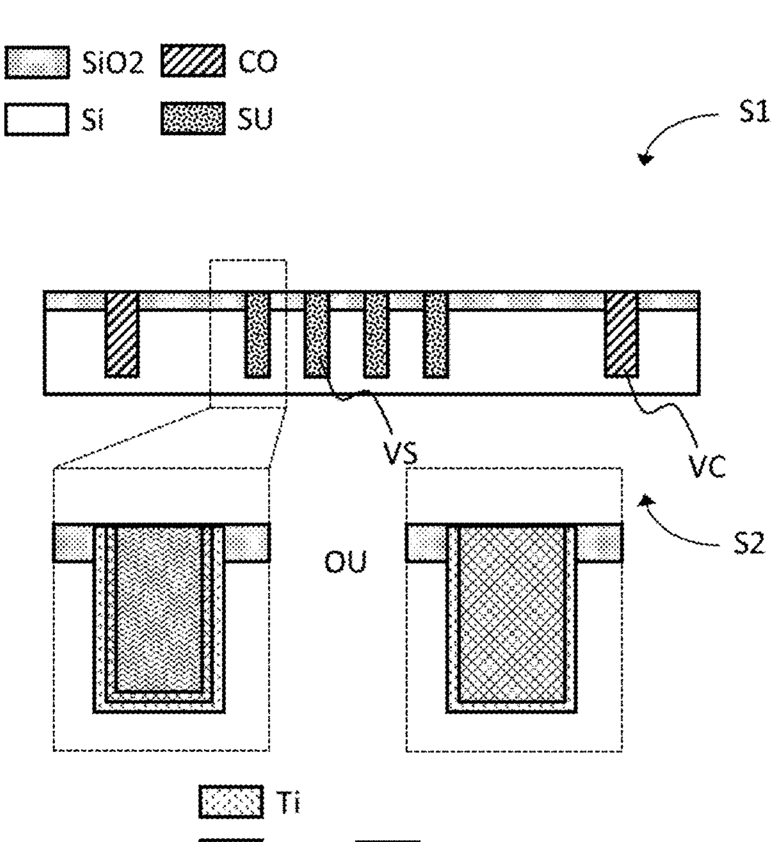
[Fig. 3F]
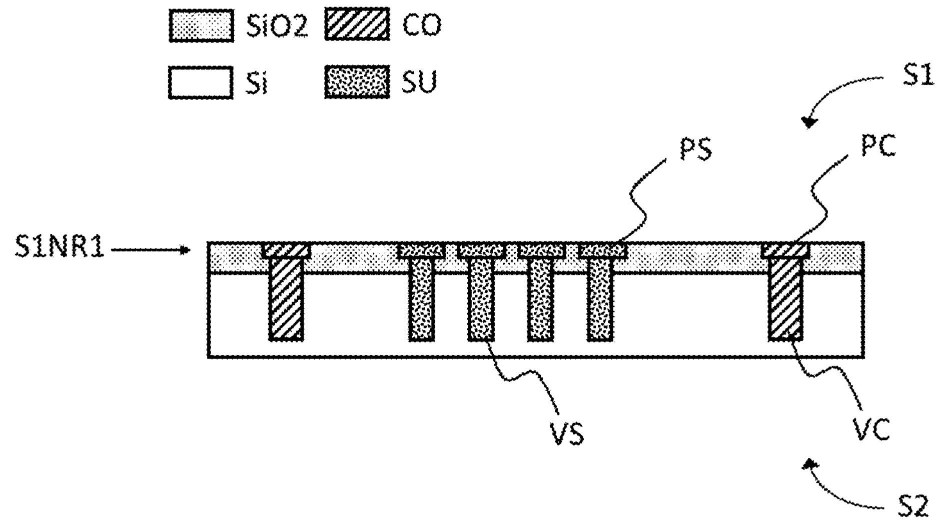

[Fig. 3G]
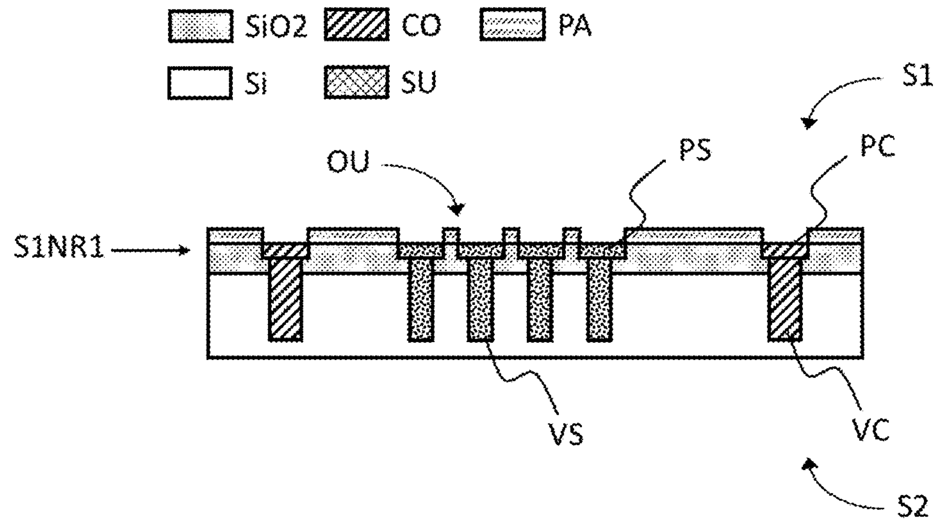
[Fig. 3H]
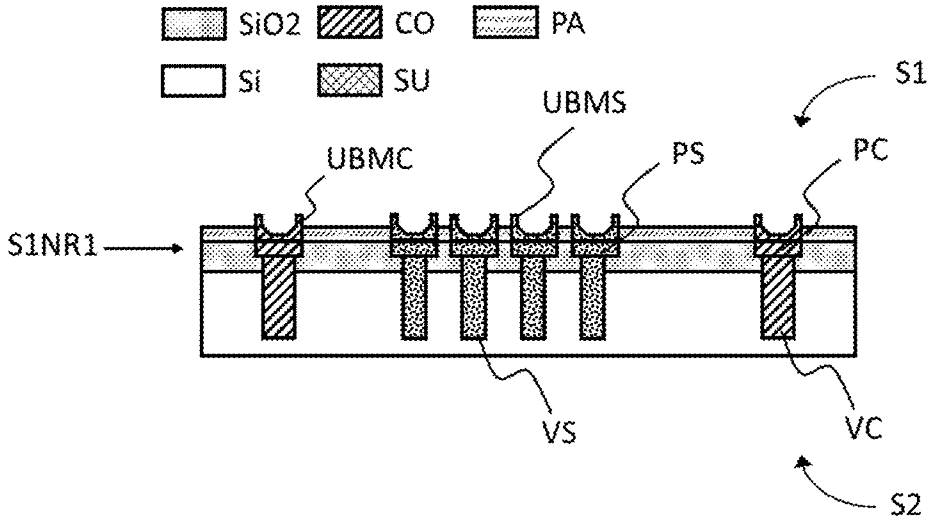

[Fig. 3I]
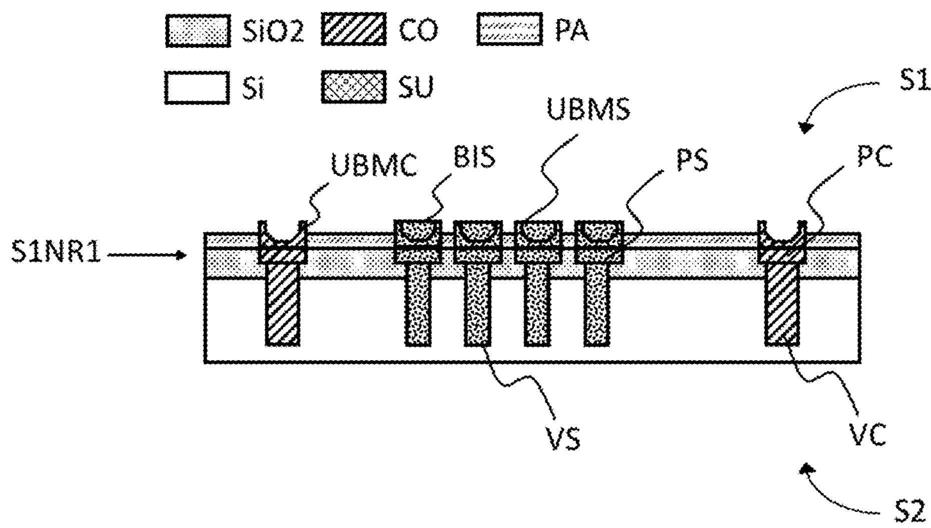
[Fig. 3J]
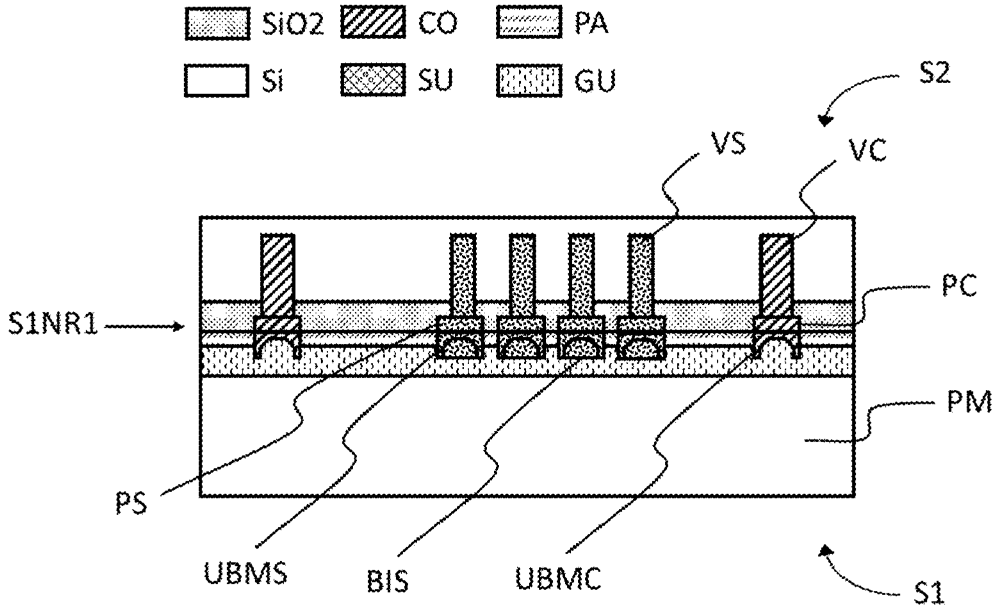

[Fig. 3K]
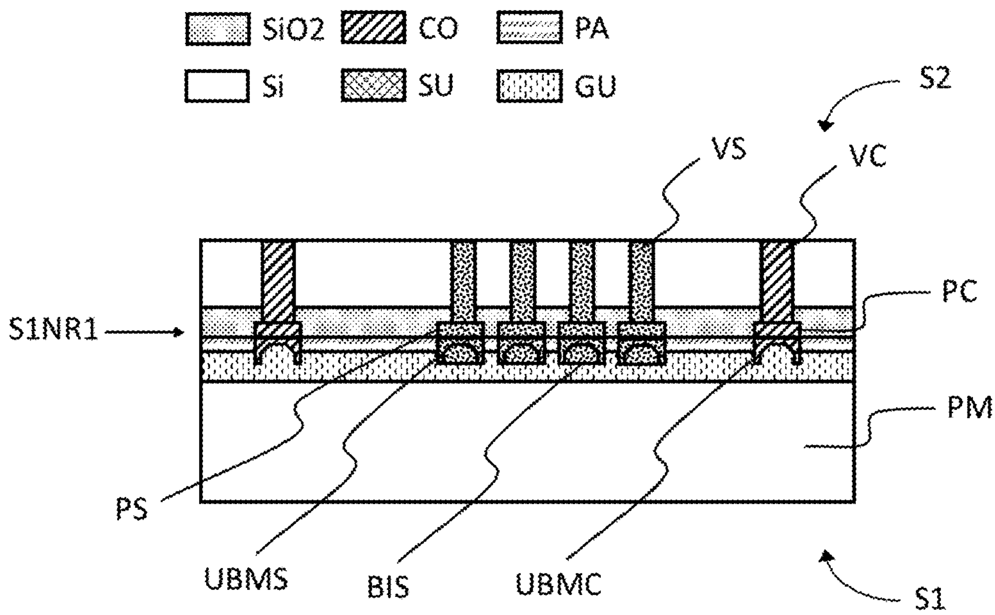
[Fig. 3L]
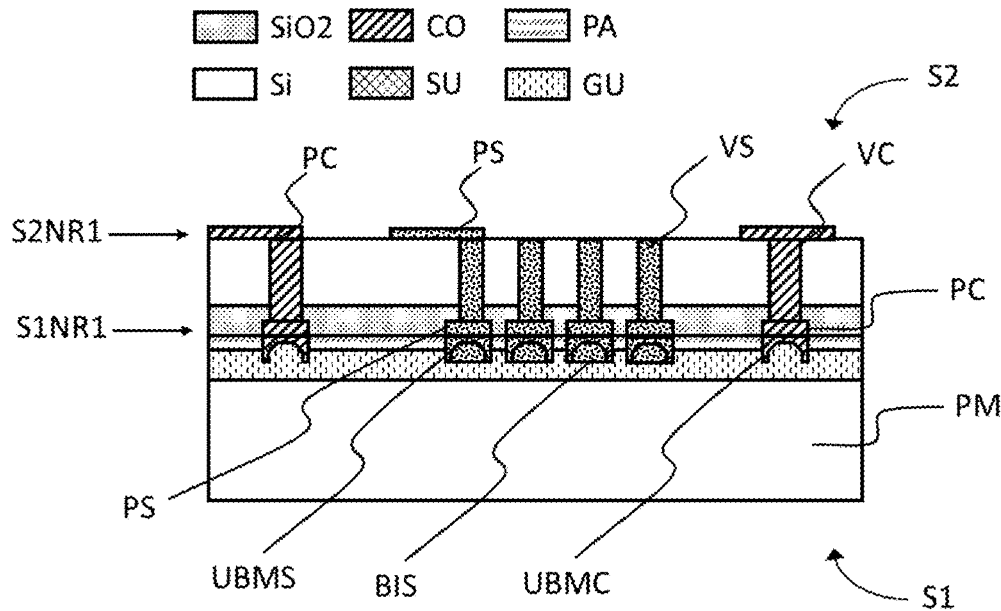

[Fig. 3M]
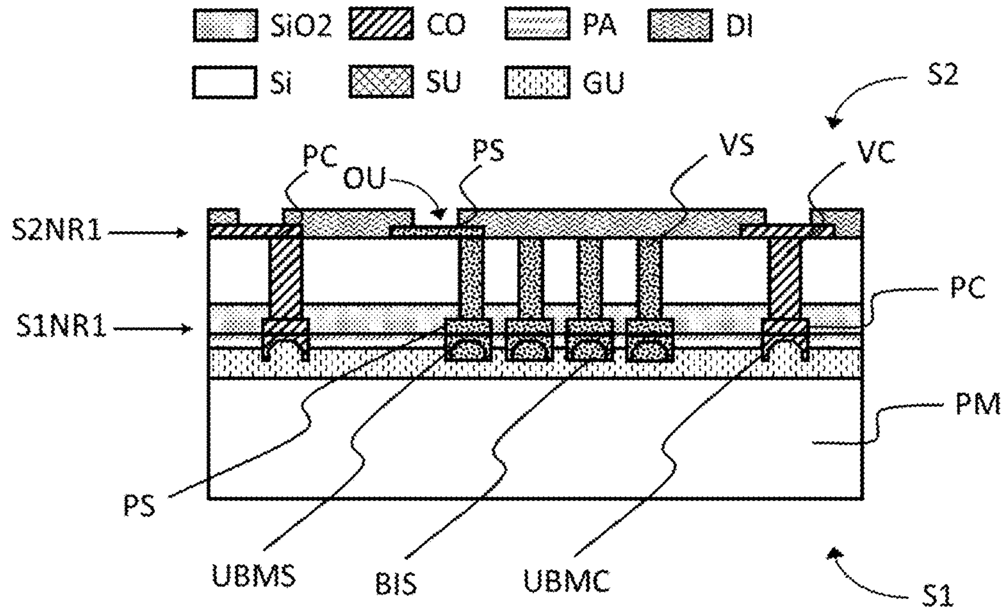
[Fig. 3N]
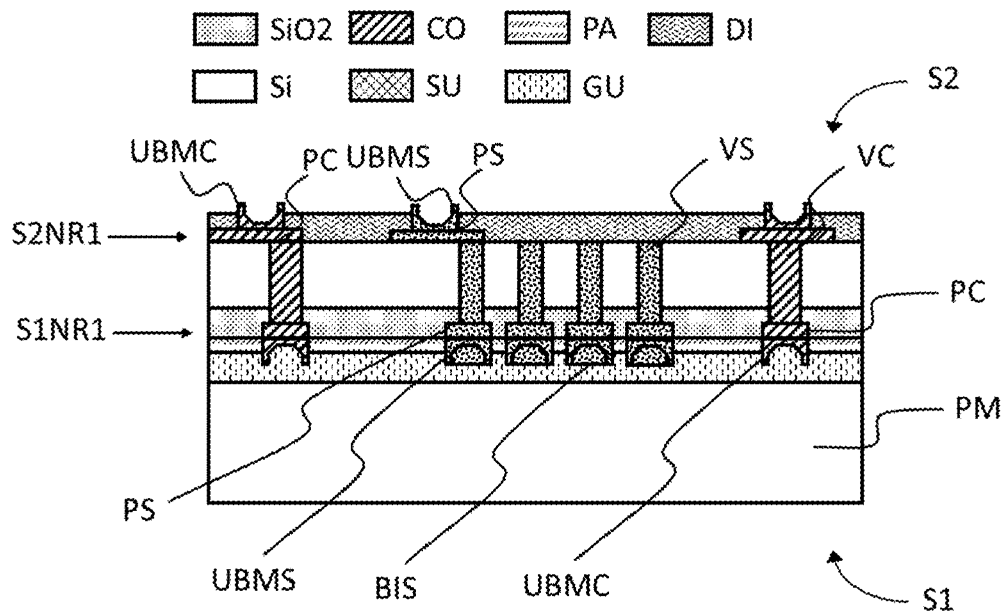

[Fig. 3O]
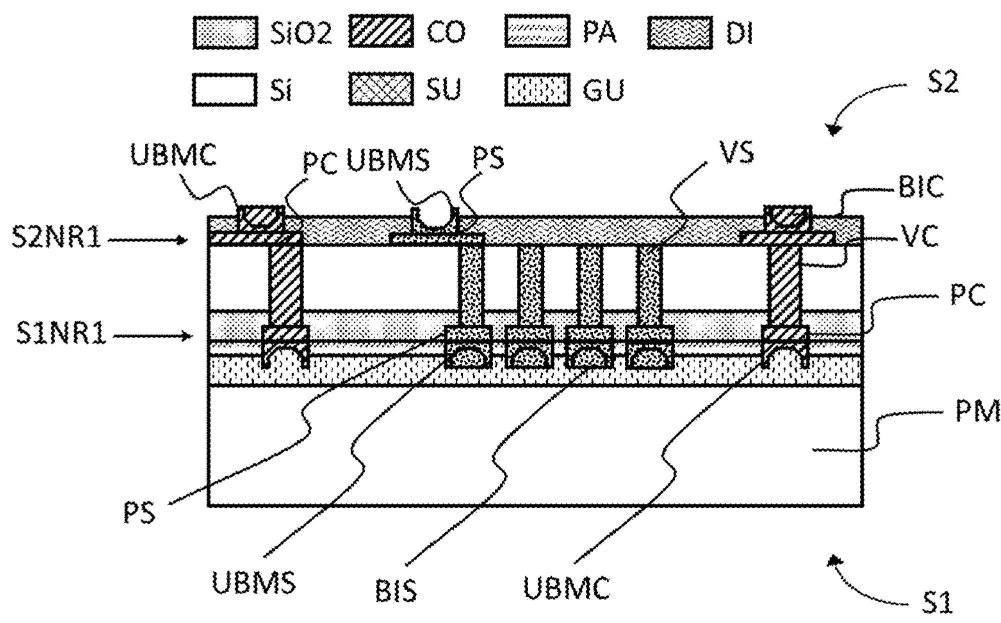
[Fig. 3P]
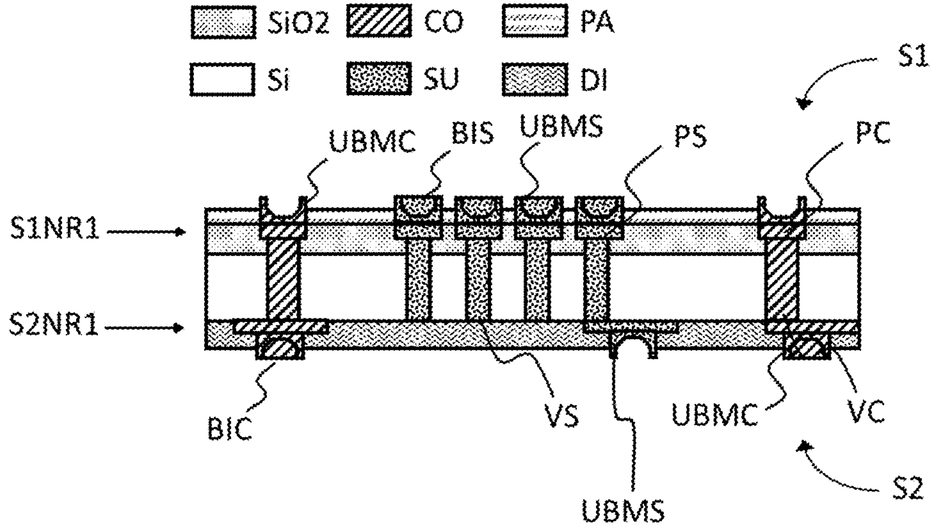

[Fig. 4A]
[Fig. 4B]
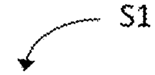
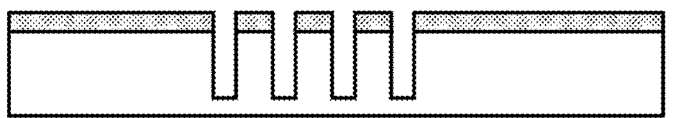

[Fig. 4C]
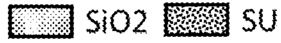
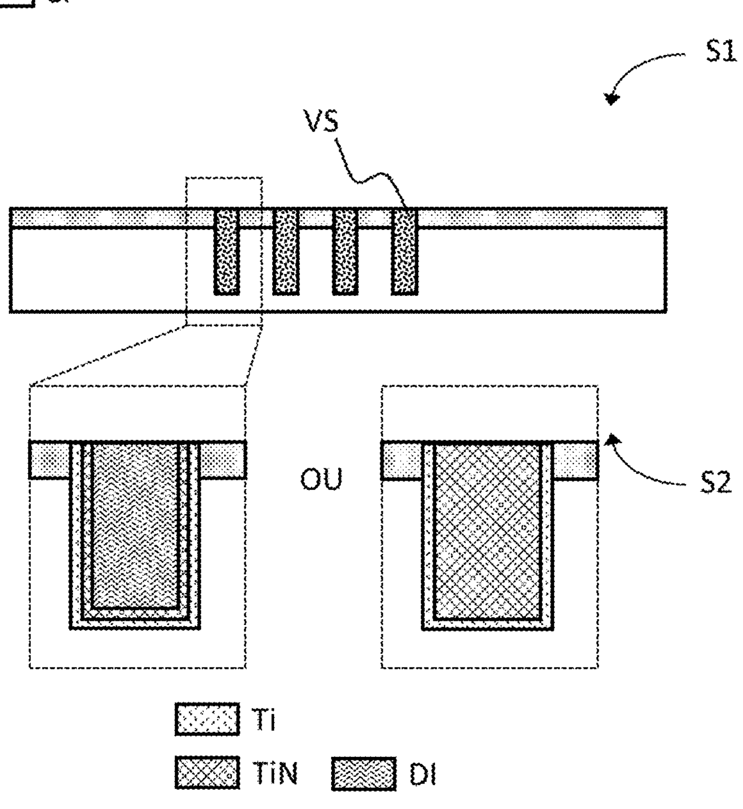
[Fig. 4D]
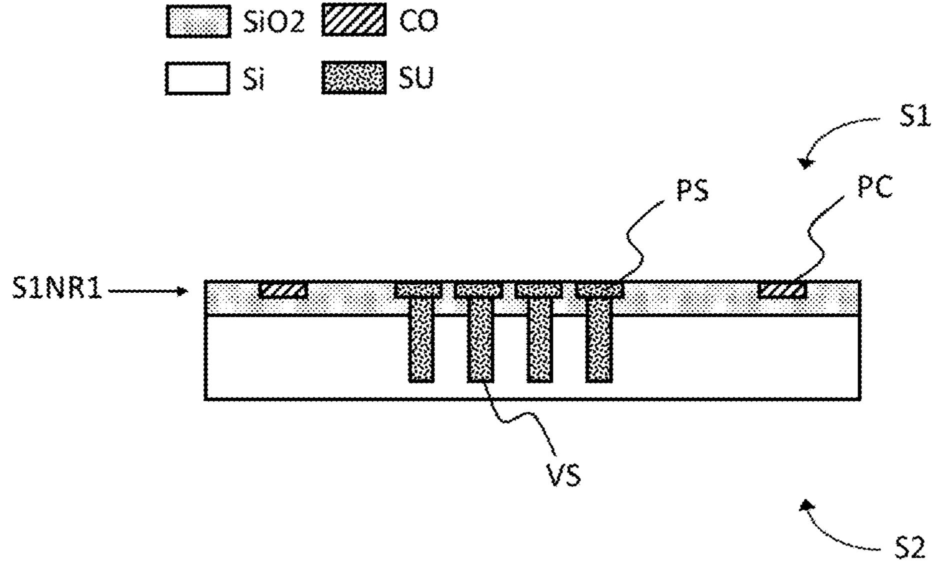

[Fig. 4E]
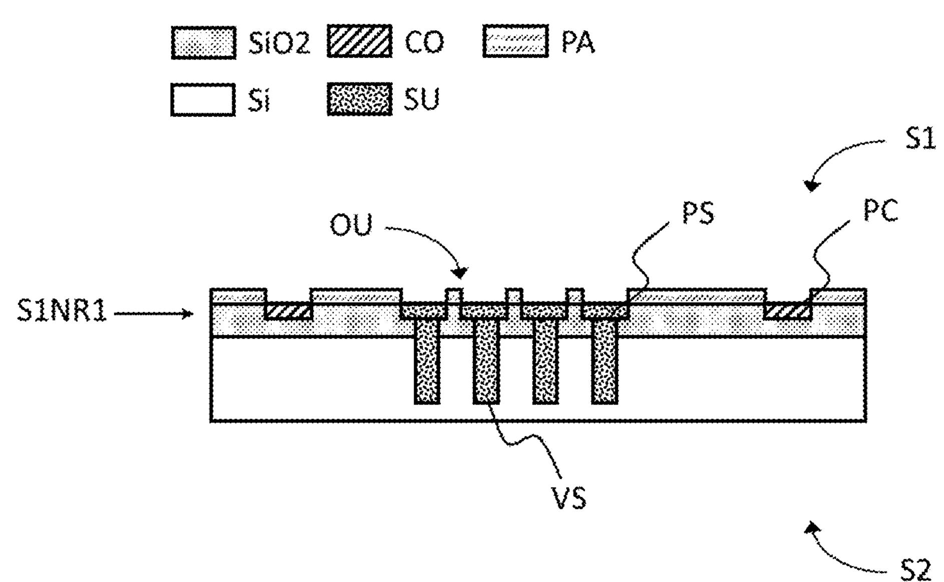
[Fig. 4F]
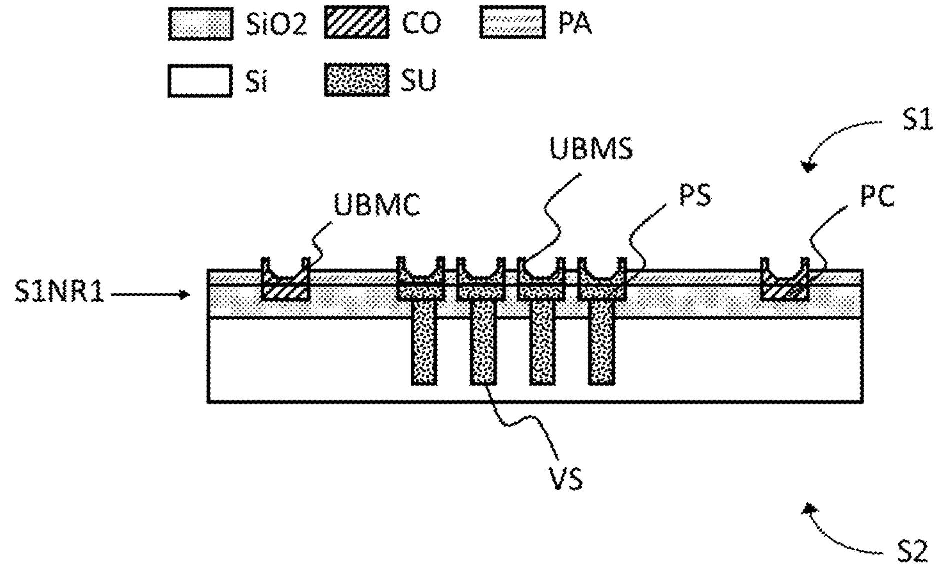

[Fig. 4G]
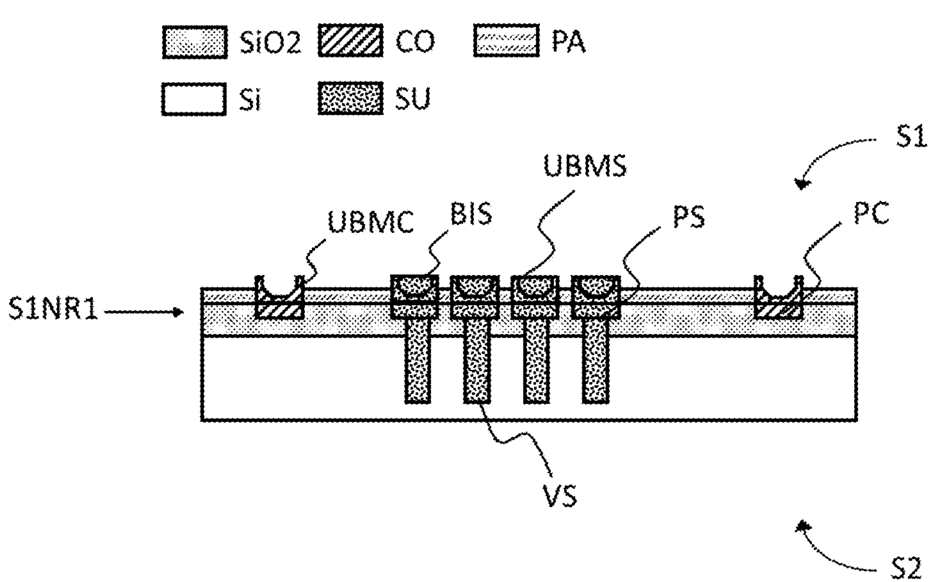
[Fig. 4H]
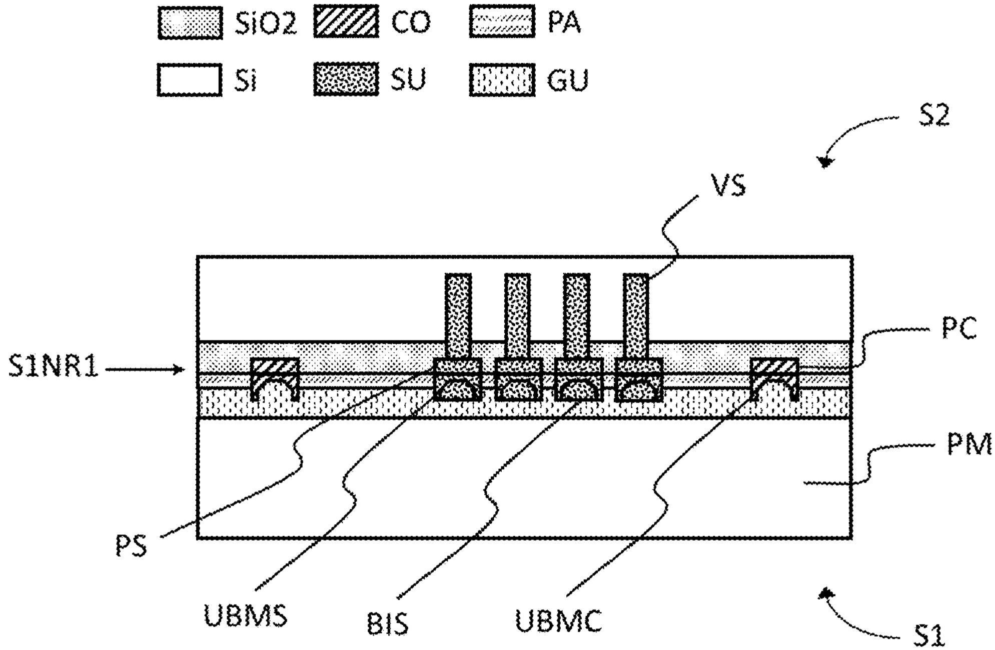

[Fig. 4I]
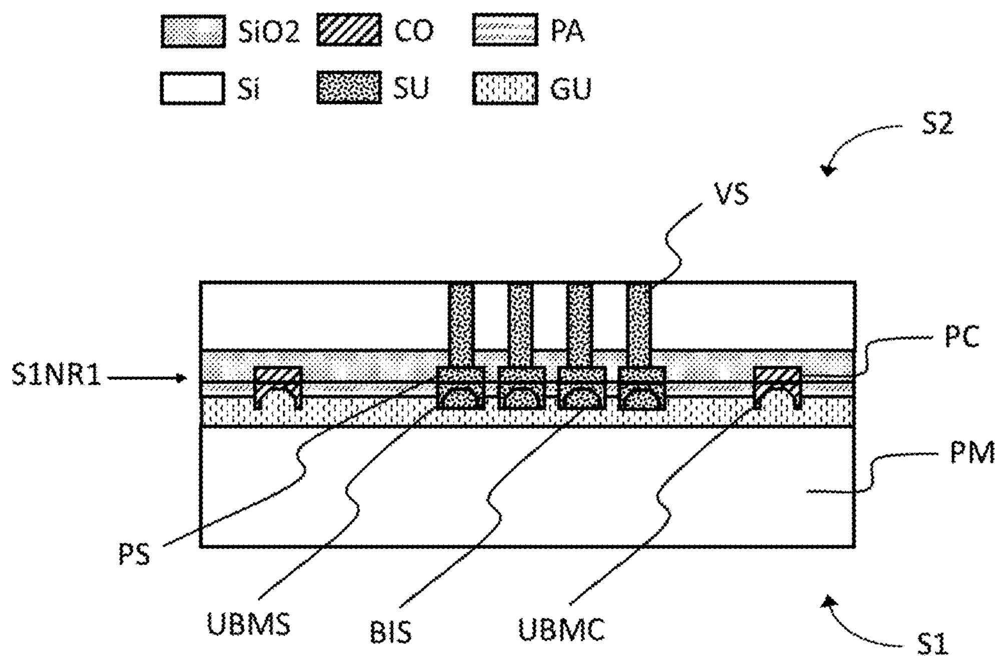
[Fig. 4J]
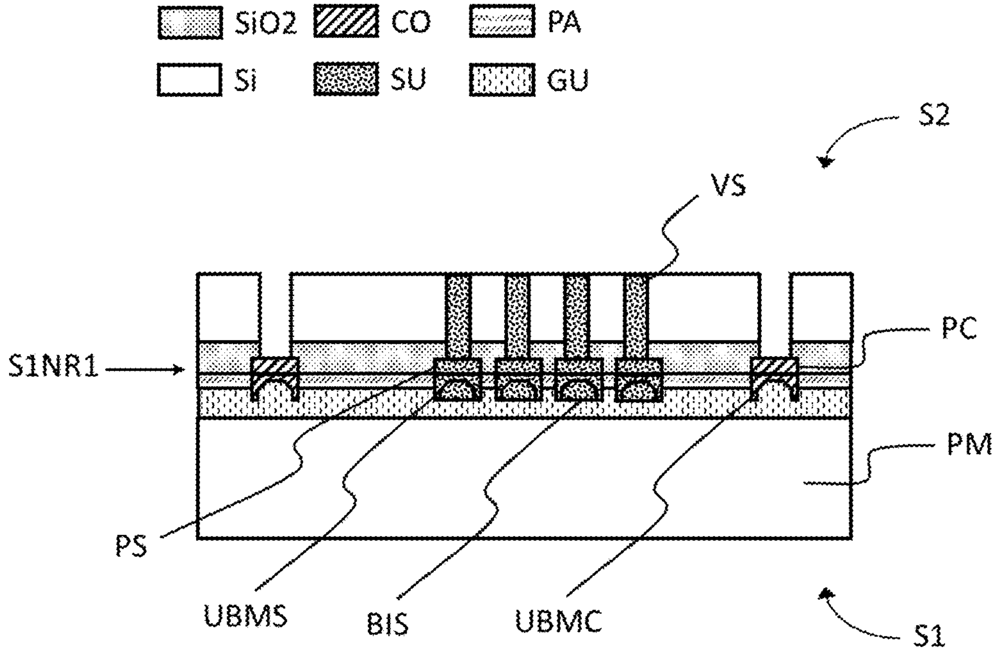

[Fig. 4K]
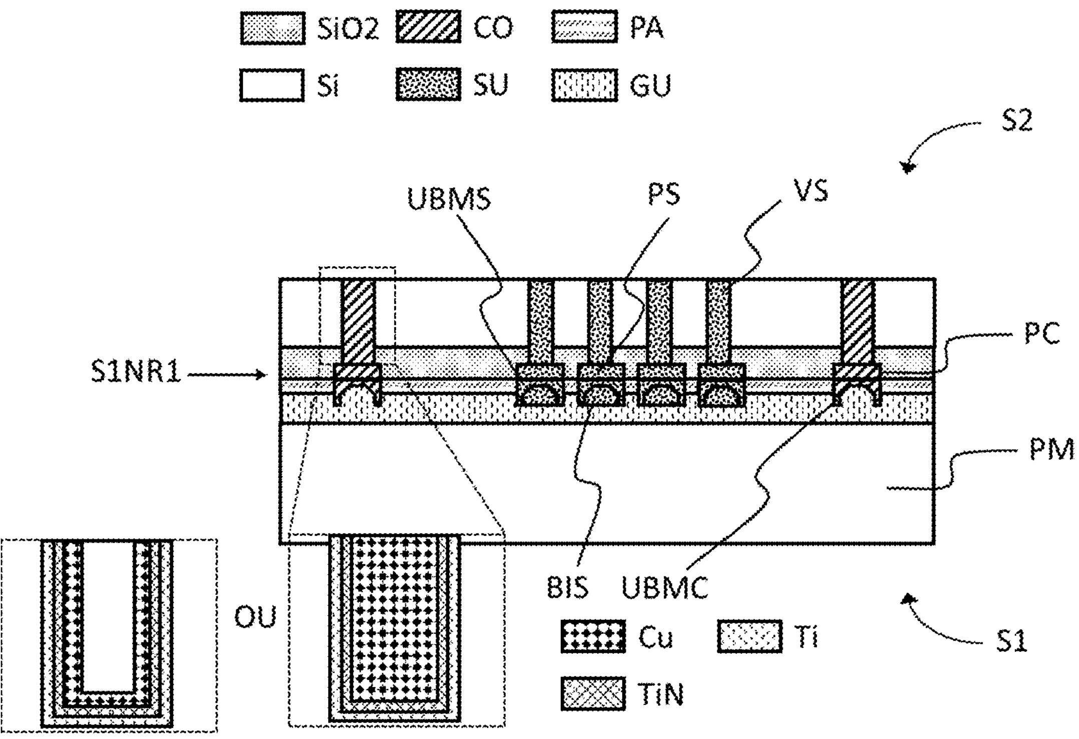
[Fig. 4L]
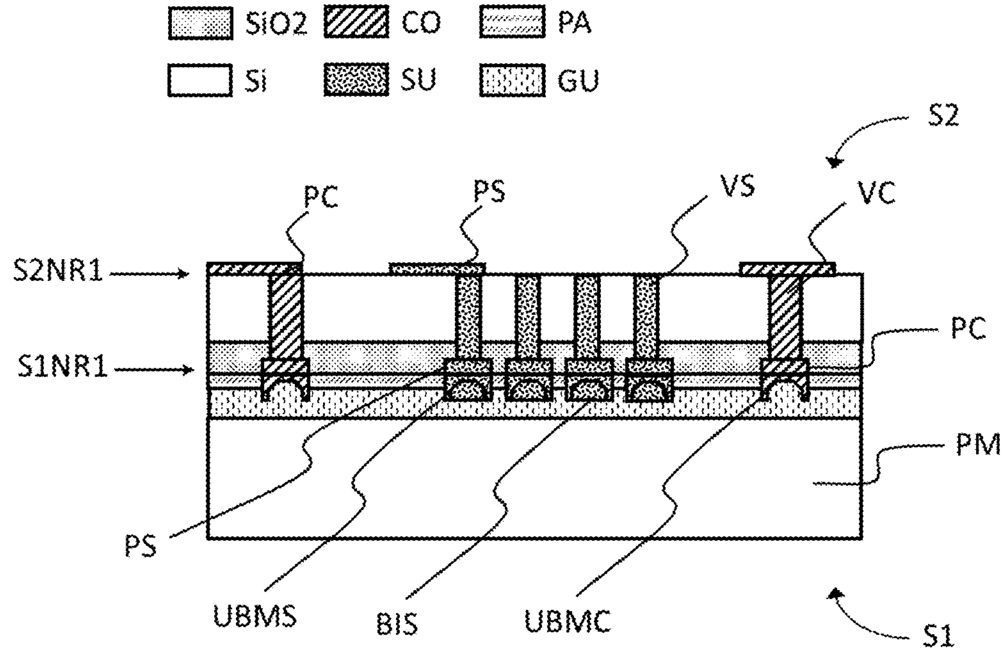

[Fig. 4M]
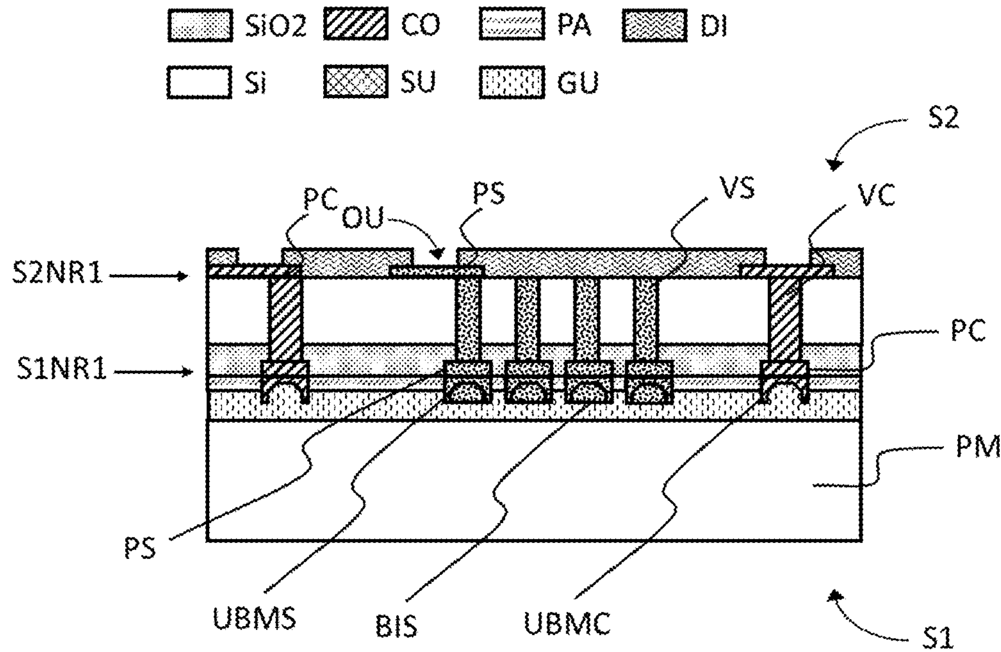
[Fig. 4N]
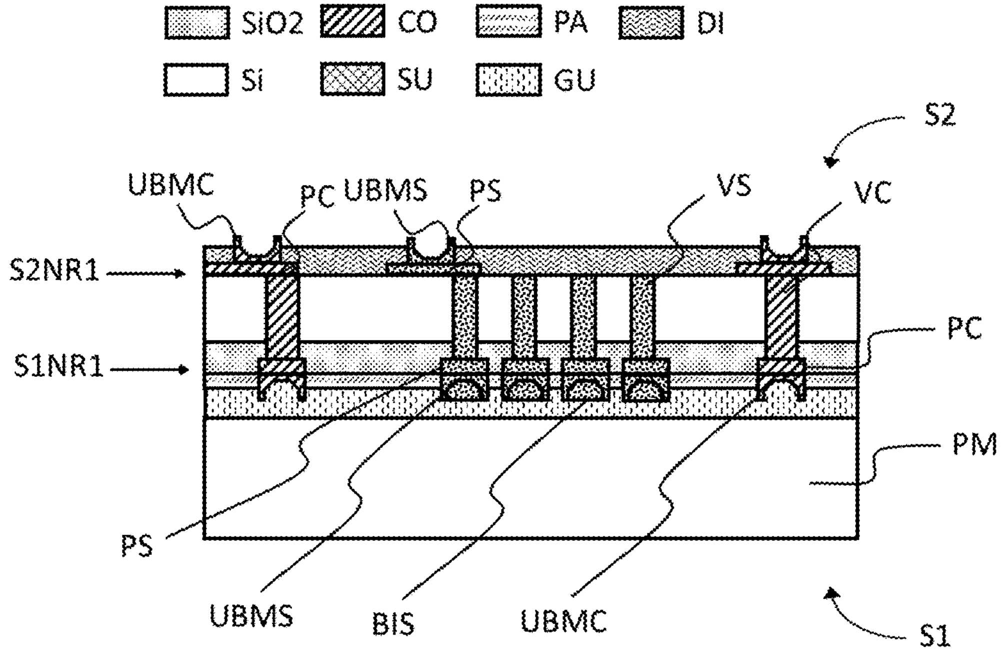

[Fig. 4O]
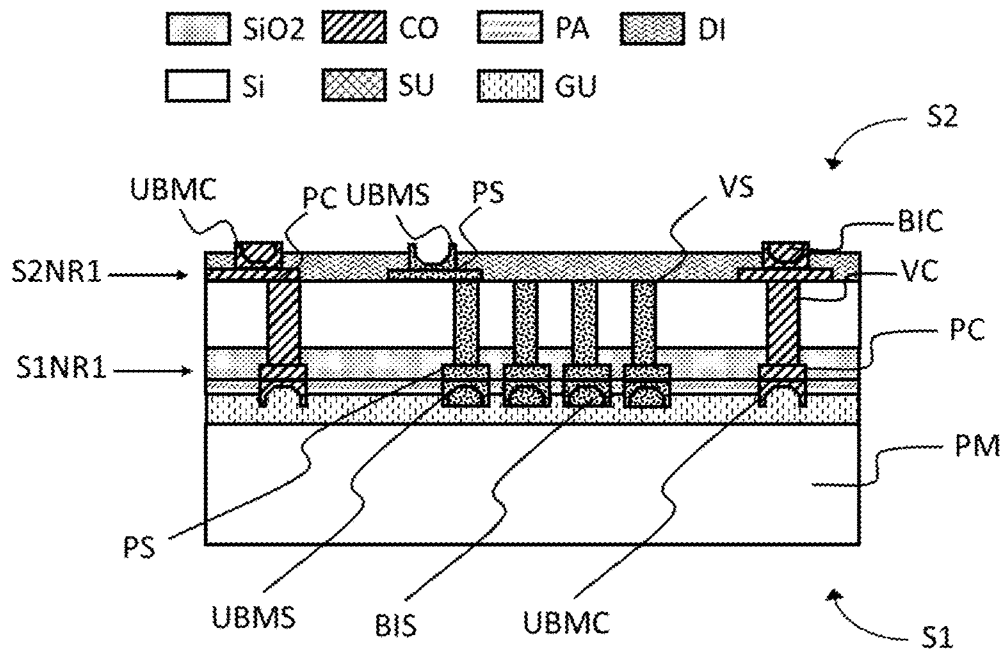
[Fig. 4P]
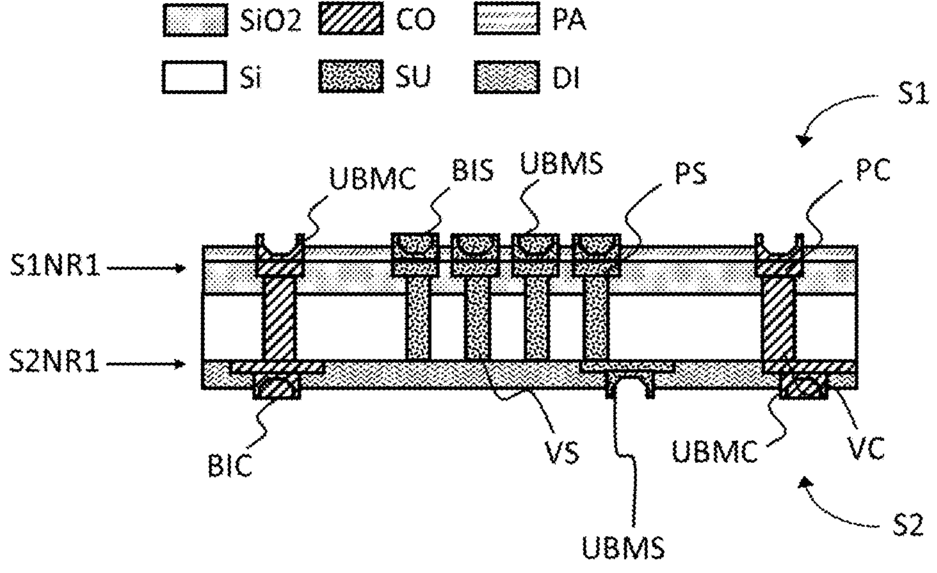

[Fig. 5A]
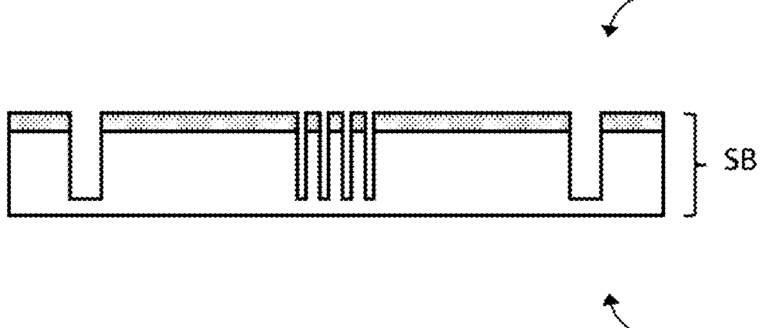
[Fig. 5B]
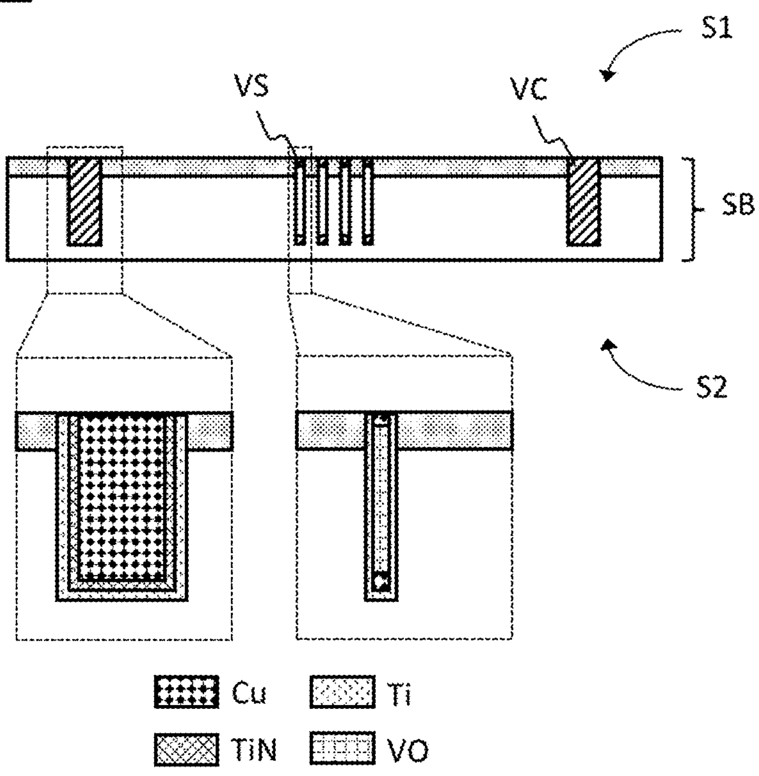

[Fig. 6A]
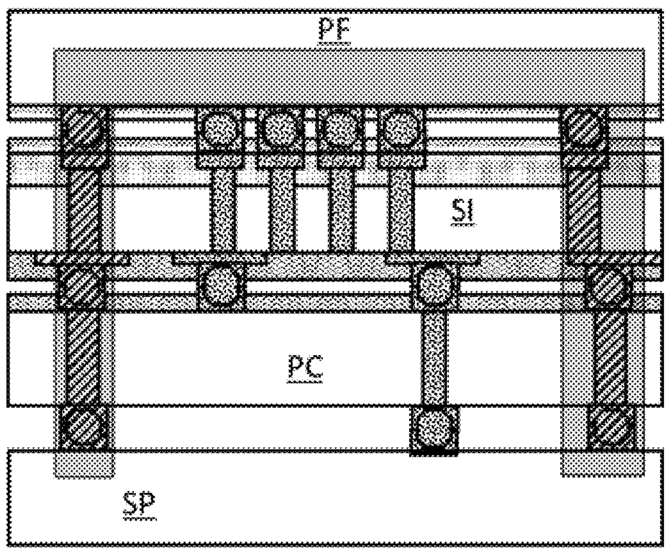
[Fig. 6B]
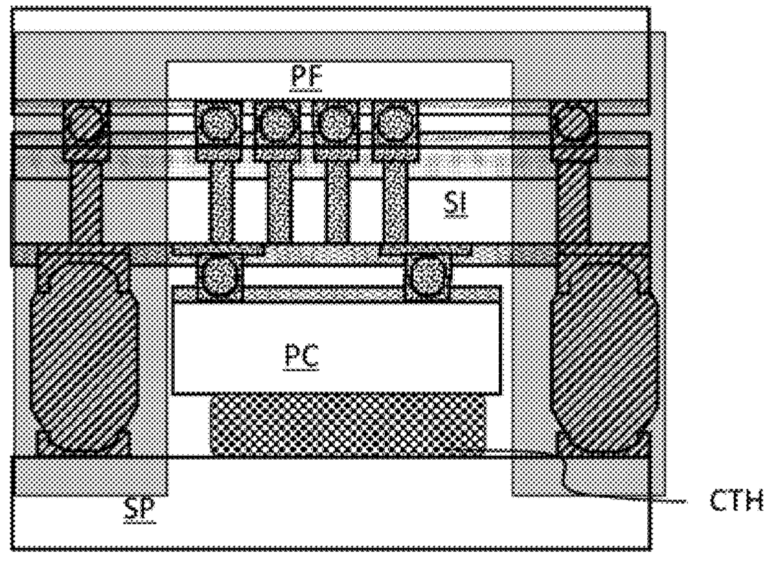

[Fig. 6C]
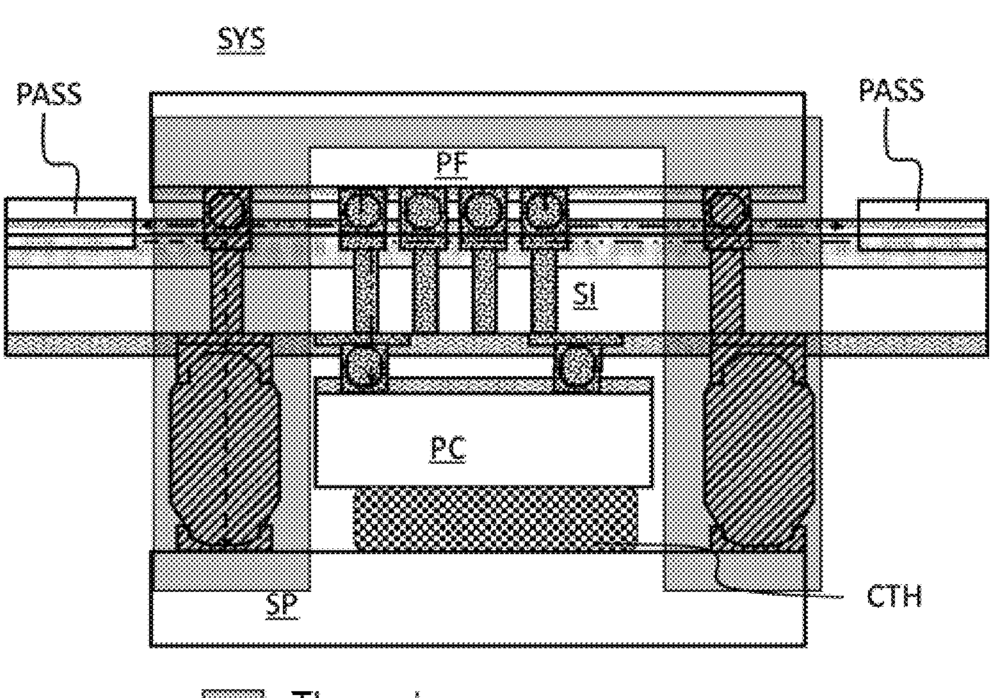

INTEGRATION STRUCTURE FOR CONNECTING A PLURALITY OF SEMICONDUCTOR DEVICES, ASSOCIATED METHODS, ASSEMBLY AND SYSTEM

CROSS-REFERENCE TO RELATED APPLICATIONS

This application claims priority to French Patent Application No. 2112738, filed Nov. 30, 2021, the entire content of which is incorporated herein by reference in its entirety.

FIELD

The technical scope of the invention is that of micro and nano systems and their assembly within the context of quantum computing.

The present invention relates to an integration structure for accommodating control chips and functional chips and in particular an integration structure comprising a bifunctional routing: thermal and electrical.

BACKGROUND

For applications relating to quantum computing, micro or nano systems generally operate at very low temperatures (in the order of a few Kelvin (K) or even a few mK) which are obtained by virtue of dilution cryostats. The thermal management of the elements that make up these systems or their packaging differs completely from what is done at room temperature, that is, around 300 K. Indeed, as the contribution of phonons to thermal conduction diminishes at $T^3$, where T is the temperature considered, thermalisation at these very low temperatures is mainly achieved by electronic thermal conductivity. In general, the integration structures of the state of the art do not take advantage of this feature in order to thermally insulate the different elements of an assembly.

For example, in document US2019/0273197 A1, the different chips of the assembly are connected to each other by means of conductive tracks so that there is thermal coupling between the different chips. This thermal coupling can be particularly problematic when one or more chips are sensitive to heating. Another example is given in document WO2018/052399 A1 in which the connection between the chips and the integration structure can be achieved through a superconducting connection bump. While such a configuration effectively thermally insulates the chips from each other, the chips are also insulated from the cryostat, which does not enable good thermalisation of the chips.

There is therefore a need for an integration structure that enables good thermalisation of the chips while ensuring good thermal insulation of the chips from each other.

SUMMARY

The invention provides a solution to the problems previously discussed, by providing an integration structure with a bifunctional routing in three dimensions (that is, in the plane of each surface of the integration structure but also outside these planes): some routing tracks and some vias ensuring a thermal and electrical function (conductive routing tracks and conductive vias) and some tracks and some vias ensuring only an electrical function (superconducting routing tracks and superconducting vias). By "thermal function", it is meant enabling thermalisation or guaranteeing maintenance of the targeted cryogenic temperature of the object to be thermalised. By "electrical function", it is meant transmitting electrical signals between the various elements of the integration structure.

A first aspect of the invention relates to an integration structure for connecting a plurality of semiconductor devices, the integration structure comprising a substrate, a first face and a second face for receiving the semiconductor devices, the integration structure comprising, at the first surface, at least one routing level, the routing level(s) comprising:

at least one non-superconducting conductive routing track of a conductive material; and at least one superconducting routing track of a superconducting material.

In addition, the integration structure comprises, at the second surface, at least one routing level, the routing level(s) comprising:

at least one non-superconducting conductive routing track of a conductive material; and at least one superconducting routing track of a superconducting material.

Furthermore, the integration structure comprises at least one non-superconducting conductive via connecting a non-superconducting conductive routing track of the first face to a non-superconducting conductive track of the second face and/or at least one superconducting via connecting a superconducting routing track of the first face to a superconducting track of the second face.

By "the routing level(s) comprising", it is meant that when a single routing level is present, it comprises at least a first conductive routing track and at least a first superconducting routing track; but when several routing levels are present, the first conductive routing track may be on a first routing level while the first superconducting routing track may be on a second routing level.

By virtue of the invention, it becomes possible to make multi-chip assemblies in three dimensions with bifunctional routing. This bifunctional routing enables a thermal insulation to be placed between the different chips connected to the integration structure, whereby electrical communication between chips can be achieved through the superconducting routing tracks and/or the superconducting vias and thermalisation can be achieved through the conductive routing tracks and/or the conductive vias, for example to create individual thermal cages at each chip so as to thermally insulate them from each other.

In addition, in the case of bifunctional routing in three dimensions, the integration structure may serve to thermally insulate a device located on its first face from a device located on its second face. More generally, bifunctional routing in three dimensions enables a more compact placement of semiconductor devices, with the third dimension (perpendicular to the surface of the integration structure) also being used.

Further to the characteristics just discussed in the preceding paragraph, the integration structure according to a first aspect of the invention may have one or more of the following complementary characteristics, considered individually or in any technically possible combination.

In one embodiment, the integration structure comprises a plurality of routing levels at the first face and/or the second face, the routing levels of the plurality of routing levels being connected, between routing tracks of the same type, by means of inter-level vias of the same type.

In one embodiment, the routing level closest to the first surface and/or the second surface only comprises one or more superconducting routing tracks.

In one embodiment, the integration structure comprises, on the first face and/or on the second face, at least one passive component, for example a plurality of passive components (for example, one or more inductors, and/or one or more capacitors, and/or one or more resistors, and/or one or more resonators), said components being made, in an embodiment, using the non-superconducting and/or superconducting conductive routing tracks associated with the face considered.

A second aspect of the invention relates to a method for manufacturing an integration structure from a substrate comprising a first face and a second face and comprising:

- a step of forming, in the substrate, at least one non-superconducting conductive non-through via and at least one superconducting non-through via, the vias comprising an end exposed at the first face;
- a step of forming at least one routing level at the first face, the routing level comprising at least one non-superconducting conductive track connected to a non-superconducting conductive via and at least one superconducting track connected to a superconducting via;
- a step of temporarily bonding the substrate to a manipulating handle at its first face;
- a step of thinning the substrate at its second face so as to expose the non-superconducting conductive vias and the superconducting vias making them through vias;
- a step of forming at least one routing level at the second face, the routing level comprising at least one non-superconducting conductive track connected to a non-superconducting via and at least one superconducting track connected to a superconducting via;
- a step of removing the manipulating handle.

Further to the characteristics just discussed in the preceding paragraph, the method according to a second aspect of the invention may have one or more of the following complementary characteristics, considered individually or in any technically possible combination.

In one embodiment, the method comprises, after the step of forming at least one routing level at the first face:

- a step of forming, at the first face, conductive under-bump metallisations at least at part of the conductive tracks and superconducting under-bumps metallisations at least at part of the superconducting tracks;
- a step of forming bumps of a type selected from superconducting bumps and non-superconducting conductive bumps, the bumps of a given type being formed at the under-bump metallisations of the same type at the first face;

In one embodiment, the method comprises, after the step of forming at least one routing level at the second face:

- a step of forming, at the second face, conductive under-bump metallisations at least at part of the conductive tracks and superconducting under-bump metallisations at least at part of the superconducting tracks;
- a step of forming bumps of a type selected from superconducting bumps and non-superconducting conductive bumps, the bumps of a given type being formed at the under-bump metallisations of the same type at the second face.

In an alternative embodiment, the method comprises, after the step of forming at least one routing level of the first face:

- A step of forming, at the first face, non-superconducting conductive pads at least at part of the non-superconducting conductive tracks, each non-superconducting conductive pad comprising, in an embodiment, a conductive layer in contact with a non-superconducting conductive track and a superconducting layer on the conductive layer;
- A step of forming, at the first face, superconducting pads at least at part of the superconducting tracks, each superconducting pad comprising, in an embodiment, a superconducting layer.

In an alternative embodiment, the method comprises, after the step of forming at least one routing level at the second face:

- a step of forming, at the second face, non-superconducting conductive pads at least at part of the non-superconducting conductive tracks, each non-superconducting conductive pad comprising, in an embodiment, a conductive layer in contact with a non-superconducting conductive track and a superconducting layer on the conductive layer;
- a step of forming, at the second face, superconducting pads at least at part of the superconducting tracks, each superconducting pad, in an embodiment, comprising a superconducting layer.

In one embodiment, the step of forming, in the substrate, at least one non-superconducting conductive non-through via and at least one superconducting non-through via comprises:

- a step of forming, in the substrate, at least one non-superconducting conductive non-through via, the via(s) comprising an end exposed at the first face;
- a step of forming, in the substrate, at least one non-superconducting non-through via, the via(s) comprising an end exposed at the first face.

In an alternative embodiment, in the step of forming at least one non-superconducting conductive non-through via and at least one superconducting non-through via, both types of vias are formed simultaneously.

A third aspect of the invention relates to a method for manufacturing an integration structure from a substrate comprising a first face and a second face and comprising:

- a step of forming, in the substrate, at least one superconducting non-through via or at least one non-superconducting conductive non-through via, the via(s) comprising an end exposed at the first face;
- a step of forming at least one routing level at the first face, the routing level comprising at least one non-superconducting conductive track connected to a conductive via when such a via has been formed in the previous step and at least one superconducting track connected to a superconducting via when such a via has been formed in the previous step
- a step of temporarily bonding the substrate to a manipulating handle at its first face; and
- a step of thinning the substrate at its second face so as to expose the non-superconducting conductive through vias or the superconducting through vias formed in the first step;
- a step of forming, in the substrate at the second face, at least one non-superconducting conductive through via if at least one superconducting via has been previously formed or at least one superconducting through via if at least one non-superconducting conductive via has been previously formed, the via(s) comprising an end at the first face in contact with at least one track of the same type of that first face, and an end exposed at the second face;
- a step of forming at least one routing level at the second face, the routing level comprising at least one non-superconducting conductive track connected to a non-superconducting conductive via and at least one superconducting track connected to a superconducting via;

a step of removing the manipulating handle.

Further to the characteristics just discussed in the preceding paragraph, the method according to a third aspect of the invention may have one or more of the following complementary characteristics, considered individually or in any technically possible combination.

In one embodiment, the method comprises, after the step of forming at least one routing level at the first face:

a step of forming, at the first surface, conductive under-bump metallisations at least at part of the conductive tracks and superconducting under-bump metallisations at least at part of the superconducting tracks;

a step of forming bumps of a type selected from superconducting bumps and non-superconducting conductive bumps, the bumps of a given type being formed at the under-bump metallisations of the same type at the first face.

In one embodiment, the method comprises, after the step of forming at least one routing level at the second face:

a step of forming, at the second face, conductive under-bump metallisations at least at part of the conductive tracks and superconducting under-bump metallisations at least at part of the superconducting tracks;

a step of forming bumps of a type selected from superconducting bumps and non-superconducting conductive bumps, the bumps of a given type being formed at the under-bump metallisations of the same type at the second face.

In an alternative embodiment, the method comprises, after the step of forming at least one routing level of the first face:

A step of forming, at the first face, non-superconducting conductive pads at least at part of the non-superconducting conductive tracks, each non-superconducting conductive pad comprising, in an embodiment, a conductive layer in contact with a non-superconducting conductive track and a superconducting layer on the conductive layer;

A step of forming, at the first face, superconducting pads at least at part of the superconducting tracks, each superconducting pad comprising, in an embodiment, a superconducting layer.

In an alternative embodiment, the method comprises, after the step of forming at least one routing level at the second face:

a step of forming, at the second face, non-superconducting conductive pads at least at part of the non-superconducting conductive tracks, each non-superconducting conductive pad comprising, in an embodiment, a conductive layer in contact with a non-superconducting conductive track and a superconducting layer on the conductive layer;

a step of forming, at the second face, superconducting pads at least at part of the superconducting tracks, each superconducting pad comprising, in an embodiment, a superconducting layer.

A fourth aspect of the invention relates to an assembly comprising an integration structure according to a first aspect of the invention, a first semiconductor device, called functional chip, and a second semiconductor device, called control chip, the functional chip being connected to the integration structure at the first face and the control chip being connected to the integration structure at the second face.

A fifth aspect of the invention relates to a system comprising a packaging support and an assembly, according to the preceding claim, electrically connected to each other.

Further to the characteristics just discussed in the preceding paragraph, the system according to a fifth aspect of the invention may have one or more of the following complementary characteristics, considered individually or in any technically possible combinations.

In one embodiment, the control chip comprises a first face and a second face and the assembly is thermally connected to the packaging support through the second face of the control chip, said control chip being electrically connected by its first face to the second face of the integration structure, for example via bumps.

In one embodiment, the assembly is electrically connected to the packaging support through the second face of the integration structure, for example via bumps.

In one embodiment, the integration structure SI includes passive components comprising an inductor and/or capacitor and/or resonator and/or resistor, said inductor and/or said capacitor and/or said resonator being electrically connected, using one or more routing tracks, for example superconducting routing tracks, to the control chip and/or functional chip, and said resistor being connected by a non-superconducting conductive link to the packaging support.

The invention and its various applications will be better understood upon reading the following description and examining the accompanying figures.

BRIEF DESCRIPTION OF THE FIGURES

The figures are set forth for indicative and in no way limiting purposes of the invention.

FIG. 1 and FIG. 2 show a schematic representation of an integration structure according to two different embodiments of the invention.

FIG. 3A to FIG. 3P show a schematic representation of a method according to a second aspect of the invention.

The FIG. 4A to FIG. 4P show a schematic representation of a method according to a third aspect of the invention.

The FIG. 5A and FIG. 5B show an alternative embodiment of a method according to a second aspect of the invention.

FIG. 6A to FIG. 6C show a schematic representation of three different embodiments of an assembly and system according to the invention.

DETAILED DESCRIPTION

The figures are set forth for indicative and in no way limiting purposes of the invention. Unless otherwise specified, a same element appearing in different figures has a single reference.

In the following, the term "non-superconducting conductive" will be used to emphasise that an element is conductive but not superconducting. However, in the present description, the term "conductive" is to be understood as "non-superconducting conductive", even when the term "non-superconducting" is absent. In an embodiment, a material is considered superconducting when its critical temperature is above 2K or even above 4K.

Integration Structure

A first aspect of the invention illustrated in FIG. 1 and FIG. 2 relates to an integration structure SI for connecting a plurality of semiconductor devices DS, the integration structure SI comprising a substrate SB, a first face S1 and a second face S2 for receiving the semiconductor devices DS.

In the structure SI of FIG. 1 and FIG. 2, the substrate SB is a substrate of silicon Si. This material has the benefit of having a high thermal resistance in the cryogenic temperature range used for the operation of the functional chips and therefore provides good thermal insulation. This is particularly beneficial within the scope of an assembly according to the invention (described later) in order to thermally insulate a first semiconductor device located on the first face S1 from a second semiconductor device located on the second face S2.

The integration structure SI according to the invention comprises, at the first surface S1, at least one routing level S1NR1, the routing level(s) S1NR1 comprising at least one non-superconducting conductive routing track PC of a conductive material CO; and at least one superconducting routing track PS of a superconducting material SU. In FIG. 1 and FIG. 2, these routing levels are made within a layer of silicon oxide $SiO_2$, but any dielectric material may be used.

In addition, the integration structure SI according to the invention comprises, at the second surface S2, at least one routing level S2NR1, the routing level(s) S2NR1 comprising at least one non-superconducting conductive routing track PC of a conductive material CO; and at least one superconducting routing track PS of a superconducting material SU. In FIG. 1 and FIG. 2, these routing levels are made within a dielectric material DI, for example silicon oxide $SiO_2$.

In one embodiment, one or more conductive tracks PC and/or one or more superconducting tracks PS located at the first face S1 and/or the second face S2 include one or more connection zones ZCC/ZCS at which conductive under-bump metallisations UBMC (for the conductive tracks PC) and superconducting under-bump metallisations UBMS (for the superconducting tracks PS) may be made.

In one embodiment, when a plurality of routing levels is present at one of the faces S1/S2 (or at both), a routing level may include only routing tracks of a given type (for example, only non-superconducting conductive routing tracks).

In one embodiment, the integration structure SI comprises, at the first face S1 (illustrated in FIG. 2) and/or the second face S2 (not illustrated), a plurality of routing levels, the routing levels of the plurality of routing levels being connected, between routing tracks PS/PC of the same type, by means of inter-level vias VIS/VIC of the same type. In FIG. 2, the integration structure SI comprises, at its first face S1, a first routing level S1NR1 and a second routing level S1NR2. At least part of the conductive tracks PC of the first routing level S1NR1 is connected to one or more conductive tracks PC of the second routing level S1NR2 by means of conductive inter-level vias VIC. Similarly, at least part of the superconducting tracks PS of the first routing level S1NR1 is connected to one or more superconducting tracks PS of the second routing level S1NR2 by means of superconducting inter-level vias VIS.

Finally, the integration structure SI according to the invention comprises at least one non-superconducting conductive via VC connecting a non-superconducting conductive routing track PC of the first face S1 to a non-superconducting conductive track PC of the second face S2 and/or at least one superconducting via VS connecting a superconducting routing track PS of the first face S1 to a superconducting track PS of the second face S2.

Thus, it is possible to establish a bifunctional routing not only at one of the faces of the integration structure, but also between these faces.

In one embodiment, a superconducting via VS/VIS (whether a through or inter-level via) comprises a solid cylinder of titanium nitride surrounded at its side surface by a layer of titanium, the layer of titanium thereby forming a hollow cylinder around said cylinder. In one embodiment, the layer of titanium has a thickness of between 5 and 20 nm, and the diameter of the solid cylinder is between 50 nm and 200 μm.

In an alternative embodiment, a superconducting via VS/VIS (whether a through or inter-level via) comprises a solid cylinder of a dielectric material surrounded at its side surface by a layer of titanium nitride, the latter forming a first hollow cylinder around the solid cylinder, the first hollow cylinder being itself surrounded, at its side 1*s* surface, by a layer of titanium forming a second hollow cylinder around the first hollow cylinder. In one embodiment, the layer of titanium has a thickness of between 5 and 20 nm, the layer of titanium nitride has a thickness of between 5 and 50 nm and the diameter of the solid cylinder is between 50 nm and 200 μm.

In a further alternative embodiment, a superconducting via VS/VIS (whether a through or inter-level via) comprises a first hollow cylinder formed by a layer of titanium nitride surrounded at its side surface by a layer of titanium, the layer of titanium thereby forming a second hollow cylinder surrounding the first hollow cylinder (in other words, the via comprises a void zone). In one embodiment, the layer of titanium has a thickness of between 5 and 20 nm and the layer of titanium nitride has a thickness of between 5 and 50 nm.

It will be appreciated that, in a same integration structure SI, some of the superconducting vias VS may be made according to the first embodiment while the others are made according to the second or third embodiment.

In one embodiment, a non-superconducting conductive via VC/VIC (whether a through or inter-level via) comprises a solid cylinder of copper surrounded at its major side surface by a layer of titanium nitride, said layer of titanium nitride thereby forming a first hollow cylinder surrounding the solid cylinder, the first hollow cylinder being itself surrounded by a layer of titanium, said layer of titanium thereby forming a second hollow cylinder surrounding the first hollow cylinder. In one embodiment, the layer of titanium has a thickness of between 5 and 20 nm, the layer of titanium nitride has a thickness of between 5 and 50 nm and the diameter of the solid cylinder is between 50 nm and 200 μm. Thus, the diameter of the cylinder of copper is sufficient to cancel the superconducting properties of the titanium nitride by proximity effect.

In one embodiment, the superconducting material used to make all or part of the superconducting routing tracks PS and/or the superconducting vias VS is selected from titanium nitride (TiN), tantalum (Ta) tantalum nitride (TaN), niobium (Nb), niobium nitride (NbN), titanium-niobium (TiNb), germanium-niobium ($Nb_3Ge$), titanium-niobium nitride (NbTiN), aluminium (Al), ruthenium (Ru) or indium (In). It will be appreciated, other superconducting materials or alloys may be selected. In an embodiment, the materials selected are materials compatible with chemical-mechanical polishing methods and/or etching methods.

In one embodiment, the conductive VC and/or superconducting VS through vias have a height of between 5 μm and 200 μm (inclusive) and, when cylindrical in shape, a diameter of between 0.5 and 200 μm (inclusive). In one embodiment, the non-superconducting conductive vias VC and the superconducting vias VS have a diameter of 10 μm, a height of 100 μm, each via being separated from the closest via by a distance greater than or equal to 10 μm.

In one embodiment, the integration structure SI includes passive elements PASS, the passive elements PASS being located outside the thermal cage formed by the non-superconducting conductive connections (comprising the conductive tracks PC and the conductive vias VC) of the assembly AS according to the invention. In one embodiment, the passive elements are selected from a (for example superconducting) inductor, a (for example superconducting) capacitor, a (for example superconducting) resonator and a (for example non-superconducting conductive) resistor. In one embodiment, the passive elements are formed in one or more routing levels at the first face S1 and/or the second face S2 of the integration structure SI, using one or more, in an embodiment superconducting, routing tracks. In an embodiment, the capacitors, inductors and resonators are made by means of superconducting tracks (PS) and the resistors by means of conductive tracks (PC).

First Manufacturing Method

A second aspect of the invention relates to a method for manufacturing an integration structure SI from a substrate comprising a first face S1 and a second face S2. In one embodiment illustrated in FIG. 3A, the substrate SB is a substrate of silicon Si including a layer of silicon oxide $SiO_2$ at the first face S1.

Forming at Least One Conductive Non-Through Via VC

The method comprises a step of forming, in the substrate SB, at least one non-superconducting conductive non-through via VC, in an embodiment a plurality of such vias, the via(s) VC comprising an end exposed at the first face S1 (this or these vias VC will be made through via(s) subsequently).

In one embodiment illustrated in FIG. 3B and FIG. 3C, this step comprises a sub-step of etching at least one trench (in an embodiment a plurality of trenches, one trench for each via—a trench may have a rectangular, ellipsoidal or round cross-section along a plane parallel to the surface of the substrate SB) at the first face S1 of the substrate SB and over only part of the thickness of the substrate SB. In the example shown in FIG. 3B, the entire thickness of the layer of silicon oxide and part of the thickness of the layer of silicon have been etched.

It also comprises a sub-step of depositing the material(s) forming the conductive via VC. In the example of FIG. 3C, this sub-step first comprises conformally depositing a layer of titanium Ti (for example by CVD, PVD or ALD), then a layer of titanium nitride TiN (for example, by CVD, PVD or ALD), followed by depositing a layer of copper Cu (for example, by PVD deposition followed by ECD deposition), the thickness of the layer of copper being selected so as to completely fill the trench etched in the previous sub-step. It should be noted here that as the thickness of copper is much greater than the thickness of titanium nitride or titanium, the copper remains conductive (and non-superconducting) and ensures that the whole via remains conductive even at very low temperatures. In one embodiment, the layer of titanium has a thickness of between 5 and 20 nm, the layer of titanium nitride has a thickness of between 5 and 50 nm and the layer of copper has a thickness of between 50 nm and 200 μm.

Forming at Least One Superconducting Non-Through Via VS

The method also comprises a step of forming, in the substrate SB, at least one superconducting non-through via VS, the via(s) VS comprising an end exposed at the first face S1 (as previously, this or these via(s) VS will be made through vias subsequently).

In one embodiment illustrated in FIG. 3D and FIG. 3E, this step comprises a sub-step of etching at least one trench (in an embodiment a plurality of trenches, one trench for each via—a trench may have a rectangular, ellipsoidal or round cross-section along a plane parallel to the surface of the substrate SB) at the first face S1 of the substrate SB and over only part of the thickness of the substrate SB. In the example of FIG. 3D, the entire thickness of the layer of silicon oxide and part of the thickness of the layer of silicon have been etched.

It also comprises a sub-step of depositing the material(s) forming the VS superconducting via.

In the example of FIG. 3E, in a first alternative embodiment, this sub-step first comprises conformally depositing a layer of titanium (for example, by CVD, PVD or ALD) followed by depositing a layer of titanium nitride (for example, by CVD, PVD or ALD), the thickness of the layer of titanium nitride being selected so as to completely fill the trench etched in the previous sub-step.

In the example of FIG. 3E, in a second alternative embodiment, this sub-step first comprises conformally depositing a layer of titanium (for example, by CVD, PVD or ALD) and then a layer of titanium nitride (for example, by CVD, PVD or ALD) followed by depositing a layer of a dielectric material DI, the thickness of the layer of dielectric material being selected so as to completely fill the trench etched in the previous sub-step. In one embodiment, the layer of titanium has a thickness of between 5 and 20 nm, the layer of titanium nitride has a thickness of between 5 and 50 nm and the dielectric layer has a thickness of between 50 nm and 200 μm.

Forming at Least One Routing Level S1NR1 at the First Face S1

As illustrated in FIG. 3F, the method also comprises a step of forming at least one routing level S1NR1, in an embodiment a plurality of routing levels, at the first face S1, the routing level S1NR1 comprising at least one non-superconducting conductive track PC connected to a non-superconducting conductive via VC and at least one superconducting track PS connected to a superconducting via VS.

More particularly, if only one routing level is present, then that routing level includes at least one non-superconducting conductive track PC and one superconducting track PS. On the other hand, if several routing levels are present at the first face S1, then a given routing level may only include one or more non-superconducting conductive tracks PC or one or more superconducting tracks PS.

Forming Under-Bump Metallisations UBM on the First Face S1

In one embodiment, the method also comprises a step of forming conductive under-bump metallisations UBMC at least at part of the conductive tracks PC and superconducting under-bump metallisations UBMS at least at part of the superconducting tracks PS.

In one embodiment illustrated in FIG. 3G, FIG. 3H and FIG. 3I, this step first comprises a sub-step of depositing a passivation layer PA followed by a sub-step of etching the passivation layer so as to form openings OU for receiving the under-bump metallisations and connecting them to the tracks of the same type. This step then comprises making, in the openings OU obtained in the previous sub-step, the non-superconducting conductive under-bump metallisation (s) UBMC at least at part of the non-superconducting conductive tracks PC and the superconducting under-bump metallisation(s) UBMS at least at part of the superconducting tracks PS. It will be appreciated that, these sub-steps are to be repeated for each type of under-bump metallisation, in other words a first time for conductive UBMC or superconducting UBMS under-bump metallisations and a second time for superconducting UBMS or conductive UBMC under-bump metallisations.

Forming Conductive BIC or Superconducting Bumps BIS on the First Face S1

In one embodiment, as illustrated in FIG. 3I, the method also comprises a step of forming bumps of a type selected from superconducting bumps BIS and non-superconducting conductive bumps BIC, the bumps BIC/BIS of a given type being formed at the under-bump metallisations UBMC/UBMS of the same type. In other words, only one type of bump is deposited in this step. In the example in FIG. 3I, only superconducting bumps BIS are deposited in this step, with the bumps BIS being deposited at the superconducting under-bump metallisations UBMS.

Forming Pads for Direct Bonding on the First Face S1

In an alternative embodiment, the under-bump metallisations UBMS/UBMC and the non-superconducting conductive bumps BIC or superconducting bumps BIS at the first face S1 are replaced by pads for direct bonding connection. More particularly, the method comprises, after the step of forming at least one routing level of the first face:

- a step of forming, at the first face, non-superconducting conductive pads at least at part of the non-superconducting conductive tracks, each non-superconducting conductive pad comprising, in an embodiment, a conductive layer in contact with a non-superconducting conductive track and a superconducting layer on the conductive layer;
- a step of forming, at the first face, superconducting pads at least at part of the superconducting tracks, each superconducting pad comprising, in an embodiment, a superconducting layer.

Thus, in this alternative embodiment in which a direct conductive-to-conductive and superconducting-to-superconducting bonding (when the non-superconducting conductive pad is made of a layer of non-superconducting conductive material) or superconducting-to-superconducting bonding (when the non-superconducting conductive pad comprises a conductive layer in contact with a non-superconducting conductive track and a superconducting layer over the conductive layer) is used enabling high density integration schemes with interconnection pitches of less than one micrometre to be contemplated. This benefit especially enables a large-scale integration of silicon spin qubits to be contemplated, whose devices are not very cumbersome with a typical surface of 100 $nm^2$ per qubit against 100 $\mu m^2$ per qubit for superconducting qubits for example.

Temporary Bonding

As illustrated in FIG. 3J, the method also comprises a step of temporarily bonding the substrate SB to a manipulating handle PM at its first face S1. In the example of FIG. 3J, this bonding is carried out using a layer of adhesive GU, for example a glue, deposited at the first face S1 and enabling the substrate SB to be bonded to the manipulating handle PM, here made of silicon Si.

Thinning

As illustrated in FIG. 3K, the method also includes a step of thinning the substrate SB at its second face S2 so as to expose the non-superconducting conductive vias VC and the superconducting vias VS, for example by chemical mechanical polishing. Thus exposed, the vias VC/VS can then be connected to one or more routing levels.

Forming at Least One Routing Level

As illustrated in FIG. 3L, the method also comprises a step of forming at least one routing level S2NR1 at the second face S2, the routing level S2NR1 comprising at least one non-superconducting conductive track PC connected to a non-superconducting conductive via VC and at least one superconducting track PS connected to a superconducting via VS.

More particularly, if only one routing level is present, then that routing level includes at least one non-superconducting conductive track PC and one superconducting track PS. On the other hand, if several routing levels are present at 1*s* the second face, then a given routing level may only include one or more non-superconducting conductive tracks PC or one or more superconducting tracks PS.

Forming Under-Bump Metallisations on the Second Face

In one embodiment, the method then comprises a step of forming, at the second face S2, conductive under-bump metallisations UBMC at least at part of the conductive tracks PC and superconducting under-bump metallisations UBMS at least at part of the superconducting tracks PS.

In one embodiment illustrated in FIG. 3M and FIG. 3N, this step comprises a sub-step of depositing a layer of a dielectric material DI, followed by a sub-step of etching said layer so as to provide openings OU for receiving the under-bump metallisations UBMS/UBMC and connecting them to the tracks of the same type. This step then comprises a sub-step of forming, in the openings OU obtained in the previous sub-step, the non-superconducting conductive under-bump metallisation UBMC at least at part of the non-superconducting conductive tracks PC and the superconducting under-bump metallisations UBMS at least at part of the superconducting routing tracks PS. It will be appreciated that, these sub-steps are to be repeated for each type of under-bump metallisation, in other words a first time for conductive UBMC or superconducting UBMS under-bump metallisations and a second time for superconducting UBMS or conductive UBMC under-bump metallisations.

Forming Conductive or Superconducting Bumps on the Second Face

In one embodiment, as illustrated in Figure FIG. 30, the method also comprises a step of forming bumps of a type selected from superconducting bumps BIS and non-superconducting conductive bumps BIC, the bumps of a given type being formed at the under-bumps metallisations UBMS/UBMC of the same type at the second face S2.

In the example shown in FIG. 30, only the non-superconducting conductive bumps BIC are deposited in this step, with the latter being deposited at the non-superconducting conductive under-bump metallisations UBMC.

Forming Pads for Direct Bonding on the Second Face S2

In an alternative embodiment, the under-bump metallisations UBMS/UBMC and the non-superconducting conductive bumps BIC or superconducting bumps BIS at the second face S2 are replaced by pads for direct bonding connection. More particularly, the method comprises, after the step of forming at least one routing level at the second face:

- a step of forming, at the second face, non-superconducting conductive pads at least at part of the non-superconducting conductive tracks, each non-superconducting conductive pad comprising, in an embodiment, a conductive layer in contact with a non-superconducting conductive track and a superconducting layer on the conductive layer;
- a step of forming, at the second face, superconducting pads at least at part of the superconducting tracks, each superconducting pad comprising, in an embodiment, a superconducting layer.

The technical benefits of this solution have already been detailed previously and are therefore not repeated here.

Removing the Manipulating Handle PM

As illustrated in FIG. 3P, the method finally includes a step of removing the manipulating handle PM.

Result

At the end of the method, an integration structure SI according to the first aspect of the invention is obtained.

Second Manufacturing Method

A third aspect of the invention relates to a method for manufacturing an integration structure SI from a substrate SB comprising a first face S1 and a second face S2. In one embodiment illustrated in FIG. 4A, the substrate SB is a substrate of silicon Si including a layer of silicon oxide $SiO_2$ at the first face S1.

Forming at Least One Superconducting Non-Through Via VS or at Least One Conductive Non-Through Via VC at the First Face S1

The method comprises a step of forming, in the substrate SB, at least one non-superconducting non-through via VS or (exclusively) at least one non-superconducting conductive non-through via VC, the via(s) VS or VC comprising an end exposed at the first face (this via or these vias will be made through via or vias subsequently).

In one embodiment, as illustrated in FIG. 4B and FIG. 4C, the via(s) are superconducting vias VS and this step comprises a sub-step of etching at least one trench (in an embodiment a plurality of trenches, one trench for each via—a trench may have a rectangular, ellipsoidal or round cross-section along a plane parallel to the surface of the substrate SB) at the first face S1 of the substrate SB and over only a portion of the thickness of the substrate SB. In the example of FIG. 4B, the entire thickness of the layer of silicon oxide and part of the thickness of the layer of silicon has been etched.

It also comprises a sub-step of depositing the material(s) forming the superconducting via. The sub-steps are identical in the case where the vias formed are non-superconducting conductive vias VC.

In the example of FIG. 4C, in a first alternative embodiment, this sub-step first comprises conformally depositing a layer of titanium (for example, by CVD, PVD or ALD) followed by depositing a layer of titanium nitride (for example, by CVD, PVD or ALD), the thickness of the layer of titanium nitride being selected so as to completely fill the trench etched in the previous sub-step. In one embodiment, the layer of titanium has a thickness between 5 and 20 nm.

In the example of FIG. 4C, in a second alternative embodiment, this sub-step first comprises conformally depositing a layer of titanium (for example, by CVD, PVD or ALD) and then a layer of titanium nitride (for example, by CVD, PVD or ALD) followed by depositing a layer of a dielectric material, the thickness of the layer of dielectric material being selected so as to completely fill the trench etched in the previous sub-step. In one embodiment, the layer of titanium has a thickness of between 5 and 20 nm and the layer of titanium nitride has a thickness of between 5 and 20 nm.

Forming at Least One Routing Level at the First Face

As illustrated in FIG. 4D, the method also comprises a step of forming at least one routing level S1NR1, in an embodiment a plurality of routing levels, at the first face S1, the routing level S1NR1 comprising at least one non-superconducting conductive track PC connected (if the latter was formed in the previous step) or intended to be connected to a conductive via and at least one superconducting track PS connected (if the latter was formed in the previous step) or intended to be connected to a superconducting via VS.

More particularly, if only one routing level is present, then that routing level includes at least one non-superconducting conductive track PC and one superconducting track PS. On the other hand, if several routing levels are present at the first face S1, then a given routing level may only include one or more non-superconducting conductive tracks PC or one or more superconducting tracks PS.

Forming Under-Bump Metallisations on the First Face S1

In one embodiment, the method further comprises a step of forming conductive under-bump metallisations UBMC at least at part of the conductive tracks PC and superconducting under-bump metallisations UBMS at least at part of the superconducting tracks PS.

In one embodiment illustrated in FIG. 4E and FIG. 4F, this step first comprises a sub-step of depositing a passivation layer PA followed by a sub-step of etching the passivation layer PA so as to form openings OU for receiving the under-bump metallisation UBMC/UBMS. This step then comprises making, in the openings OU obtained in the previous sub-step, the non-superconducting conductive under-bump metallisation(s) UBMC at least at part of the non-superconducting conductive tracks PC and the superconducting under-bump metallisation(s) UBMS at least at part of the superconducting routing tracks PS. It will be appreciated that, these sub-steps are repeated for each type of under-bump metallisation, in other words a first time for conductive UBMC or superconducting UBMS under-bump metallisations and a second time for superconducting UBMS or conductive UBMC under-bump metallisations.

Forming Conductive BIC or Superconducting BIS Bumps on the First Face S1

In one embodiment, as illustrated in FIG. 4G, the method also comprises a step of forming bumps of a type selected from superconducting bumps BIS and non-superconducting conductive bumps BIC, the bumps BIC/BIS of a given type being formed at the under-bump metallisations UBMC/UBMS of the same type. In other words, only one type of bumps BIC/BIS is deposited in this step. In the example of FIG. 4G, only superconducting bumps BS are deposited in this step, the latter being deposited at the superconducting under-bump metallisations UBMS.

Forming Pads for Direct Bonding on the First Face S1

In an alternative embodiment, the under-bump metallisations UBMS/UBMC and the non-superconducting conductive bumps BIC or superconducting bumps BIS at the first face S1 are replaced by pads for direct bonding connection. More particularly, the method comprises, after the step of forming at least one routing level of the first face:

- A step of forming, at the first face, non-superconducting conductive pads at least at part of the non-superconducting conductive tracks, each non-superconducting conductive pad comprising, in an embodiment, a conductive layer in contact with a non-superconducting conductive track and a superconducting layer on the conductive layer;
- A step of forming, at the first face, superconducting pads at least at part of the superconducting tracks, each superconducting pad comprising, in an embodiment, a superconducting layer.

The technical benefits of this solution have already been detailed previously and are therefore not repeated here.

Temporary Bonding

As illustrated in FIG. 4H, the method also includes a step of temporarily bonding the substrate SB to a manipulating handle PM at its first face S1. In the example of FIG. 4H, this bonding is carried out using a layer of adhesive GU, for example a glue, deposited at the first face S1 and enabling the substrate SB to be bonded to the manipulating handle PM, here made of silicon.

Thinning

As illustrated in FIG. 4I, the method also includes a step of thinning the substrate SB at its second face S2 so as to expose the superconducting vias VS making them through vias, for example by chemical mechanical polishing. Thus exposed, the vias VS can then be connected to one or more routing levels.

Forming at Least One Conductive VC or Superconducting VS Through Via

The method then comprises a step of forming, in the substrate SB, at least one non-superconducting conductive through via VC if the previously formed via(s) are superconducting vias VS or at least one superconducting through via VS if the previously formed vias are non-superconducting conductive vias VC, the via(s) thus formed comprising an end exposed at the first face S1 and in contact with at least one conductive track PC of this first face S1 in the case of conductive vias VC or at least one superconducting track PS of this first face S1 in the case of superconducting vias VS, and an end exposed at the second face S2.

In one embodiment illustrated in FIG. 4J and FIG. 4K, the via(s) are non-superconducting conductive vias VC (superconducting vias VS having been formed previously) and this step comprises a sub-step of etching at least one trench (in an embodiment a plurality of trenches, one trench for each via) at the second face S2 of the substrate SB and through the entire thickness of the substrate SB until a routing track of the same type of the first face S1 is reached.

It also comprises a sub-step of depositing the material(s) forming the non-superconducting conductive via VC. The sub-steps are identical in the case where the vias formed are superconducting vias VS.

In an example illustrated in FIG. 4K, this sub-step first comprises conformally depositing a layer of titanium (for example, by CVD, PVD or ALD), then a layer of titanium nitride (for example, by CVD, PVD or ALD), followed by depositing a layer of copper (for example, by PVD and then ECD deposition), the thickness of the layer of copper being selected so as to partially or completely fill the trench etched in the previous sub-step. When the trench is only partially filled by the layer of copper, then the thickness of the layer of copper is in an embodiment greater than or equal to 500 nm so as to induce the conductive state in the superconducting layers of the via by proximity effect. One of the benefits of this method according to a third aspect of the invention is that the non-superconducting conductive vias VC are made at the end of the method, which enables wider non-superconducting conductive vias VC to be made, that can be filled by electrolysis (ECD) (even for layers of titanium and titanium nitride). It should be noted here that since the thickness of copper is much greater than the thickness of titanium nitride or titanium, the copper and the whole via remain conductive (and non-superconducting) even at very low temperatures.

Forming at Least One Routing Level at the Second Face S2

As illustrated in FIG. 4L, the method also includes a step of forming at least one routing level S2NR1 at the second face S2, the routing level comprising at least one non-superconducting conductive track PC connected to a non-superconducting conductive via VC and at least one superconducting track PS connected to a superconducting via VS.

More particularly, if only one routing level is present, then that routing level includes at least one non-superconducting conductive track PC and at least one superconducting track PS. On the other hand, if several routing levels are present at the second face S2, then a given routing level may only include one or more non-superconducting conductive tracks PC or one or more superconducting tracks PS.

Forming Under-Bump Metallisations on the Second Face S2

In one embodiment, the method then comprises a step of forming, at the second face S2, conductive under-bump metallisations UBMC at least at part of the conductive tracks PC and superconducting under-bump metallisations UBMS at least at part of the superconducting tracks PS.

In one embodiment illustrated in FIG. 4M and FIG. 4N, this step comprises a sub-step of depositing a layer of a dielectric material DI, followed by a sub-step of etching said layer DI so as to provide openings OU for receiving the under-bump metallisation UBMS/UBMC. This step then comprises making, in the openings OU obtained during the previous sub-step, the non-superconducting conductive under-bump metallisation(s) UBMC at least at part of the non-superconducting conductive tracks PC and the superconducting under-bump metallisation(s) UBMS at least at part of the superconducting routing tracks PS. It will be appreciated that, these sub-steps are repeated for each type of under-bump metallisation, in other words a first time for conductive UBMC or superconducting UBMS under-bump metallisations and a second time for superconducting UBMS or conductive UBMC under-bump metallisations.

Forming Conductive or Superconducting Bumps on the Second Face S2

In one embodiment, as illustrated in Figure FIG. 4O, the method also comprises a step of forming bumps BIC/BIS of a type selected from superconducting bumps BIS and non-superconducting conductive bumps BIC, the bumps BIC/BIS of a given type being formed at the under-bump metallisations UBMC/UBMS of the same type at the second face S2.

In the example of FIG. 4O, only non-superconducting conductive bumps BIC are deposited in this step, with the bumps BIC being deposited at the non-superconducting conductive under-bump metallisations UBMC.

Forming Pads for Direct Bonding on the Second Face S2

In an alternative embodiment, the under-bump metallisations UBMS/UBMC and the non-superconducting conductive bumps BIC or the superconducting bumps BIS at the second face S2 are replaced by pads for direct bonding connection. More particularly, the method comprises, after the step of forming at least one routing level at the second face:

- a step of forming, at the second face, non-superconducting conductive pads at least at part of the non-superconducting conductive tracks, each non-superconducting conductive pad comprising, in an embodiment, a conductive layer in contact with a non-superconducting conductive track and a superconducting layer on the conductive layer;
- a step of forming, at the second face, superconducting pads at least at part of the superconducting tracks, each superconducting pad comprising, in an embodiment, a superconducting layer.

The technical benefits of this solution have already been detailed previously and are therefore not repeated here.

Removing the Manipulating Handle

As illustrated in FIG. 4P, the method finally comprises a step of removing the manipulating handle PM.

Result

At the end of the method, an integration structure SI according to the first aspect of the invention is obtained.

Third Manufacturing Method

Another aspect of the invention relates to a method for manufacturing an integration structure SI from a substrate SB comprising a first face S1 and a second face S2. In one embodiment, the substrate SB is a substrate of silicon including a layer of silicon oxide at the first face.

Simultaneously Forming at Least One Superconducting Non-Through Via and One Conductive Non-Through Via The method according to this aspect comprises a step of simultaneously forming at least one superconducting non-through via VS and a non-superconducting conductive non-through via VC.

In one embodiment illustrated in FIG. 5A and FIG. 5B, this step comprises a sub-step of forming a first plurality of cylindrical holes (or trenches—embodiment not represented) and a second plurality of cylindrical holes (or trenches), the cylindrical holes (or trenches) of the first plurality having a diameter (or width for trenches) of between 10 and 100 μm and a height (or depth) of between 100 and 200 μm and the cylindrical holes (or trenches) of the second plurality having a diameter (or width for trenches) of between 0.5 to 5 μm and a height (or depth) of between 50 and 200 μm (and in an embodiment identical to that of the cylindrical holes of the first plurality of cylindrical holes). In one embodiment, when a first and a second plurality of trenches are formed in this sub-step, then the length of these trenches is between once the width and fifty times the width of said trenches.

This step then comprises a sub-step of conformally depositing a layer of titanium (for example, by CVD or PVD) followed by a sub-step of conformally depositing a layer of titanium nitride (for example, by CVD). In one embodiment, the deposited layer of titanium has a thickness of between 5 and 20 nm. In one embodiment, the layer of titanium nitride has a thickness of between 5 and 50 nm.

This step finally comprises a sub-step of depositing a layer of copper, this deposition being carried out in two phases, a first phase of deposition by PVD technique and a second phase of deposition by ECD technique. During the first phase, a layer of copper will form at the bottom of the holes formed during etching. In the case of the second plurality of cylindrical holes (or trenches), given the small diameter of the holes (or the small width of the trenches), a plug of copper will also form at the entrance to each hole (or trench) so as to obstruct the latter. During the second phase, the cylindrical holes (or trenches) of the first plurality will then fill with copper while the cylindrical holes (or trenches) of the second plurality of cylindrical holes will remain empty in their centre. Thus, in a same deposition sub-step, the first plurality of cylindrical holes enables non-superconducting conductive vias VC to be obtained while the second plurality of cylindrical holes enables superconducting vias VS to be obtained. Thus, as already mentioned, for non-superconducting conductive vias VC, the diameter of the cylinder of copper (or the thickness of the layer of copper in the case of trenches) is sufficient to cancel the superconducting properties of titanium nitride by proximity effect. On the other hand, in the absence of a cylinder of copper (or layer of copper) for the superconducting vias VS, titanium nitride remains superconducting.

The steps of the method are then identical to the steps of the method according to a second aspect of the invention after forming the conductive VC and superconducting VS vias. Thus, this method can be considered as an alternative to the method according to a first aspect of the invention.

Assembly According to the Invention

A fourth aspect of the invention illustrated in FIG. 6A to FIG. 6C relates to an assembly comprising an integration structure SI according to a first aspect of the invention, a first semiconductor device DS, called functional chip PF, and a second semiconductor device, called control chip PC, the functional chip PF being connected to the integration structure SI at the first face S1 and the control chip being connected to the integration structure at the second face S2.

In one embodiment illustrated in FIG. 6 A to FIG. 6C, the functional chip PF and/or the control chip PC include conductive under-bump metallisations and superconducting under-bump metallisations, the conductive under-bump metallisations of the functional chip PF and/or the control chip PC being connected to the conductive under-bump metallisations UBMC of the integration structure SI using non-superconducting conductive bumps BIC and the superconducting under-bump metallisations UBMS of the functional chip PF and/or the control chip PC being connected to the superconducting under-bump metallisations UBMS of the integration structure SI using superconducting bumps BIS. Thus, a thermal cage (shaded in the figures) is formed from the conductive vias VC, the conductive tracks PC, the under-bump metallisations UBMC and the conductive bumps BIC surrounding the integration structure SI, the functional chip PF and the control chip PC.

In an alternative embodiment not represented, the functional chip PF and/or the control chip PC include non-superconducting conductive pads and superconducting pads, the non-superconducting conductive pads of the functional chip PF and/or the control chip PC being connected to the non-superconducting conductive pads of the integration structure SI by direct bonding so as to form first connection means and the superconducting pads of the functional chip PF and/or the control chip PC being connected to the superconducting pads of the integration structure SI by direct bonding so as to form second connection means. In one embodiment, each first connection means comprises a first layer of a non-superconducting conductive material, a second layer of a superconducting material and a third layer of a non-superconducting conductive material, the bonding being carried out at the layer of superconducting material. In this same embodiment, the second connection means 2*s* are fully superconducting. For the connection means, the term "of a conductive material" or "of a superconducting material" may here refer to a plurality of layers of the same material which, after bonding, form a single layer of that material.

In one embodiment, the substrate SB of the integration structure SI is a substrate of silicon, which enables the thermal insulation of the functional chip PF with respect to the control chip PC to be improved because Si becomes thermally insulating at the very low temperatures necessary for the operation of the functional chips PF.

System According to the Invention

A fifth aspect of the invention relates to a system SYS comprising a packaging support SP and an assembly according to a fourth aspect of the invention electrically connected to the packaging support SP. In one embodiment, the packaging support is a ball grid array or a land grid array.

In one embodiment illustrated in FIG. 6A, the control chip comprises a first face and a second face and the assembly is connected to the packaging support SP through the second face of the control chip PC.

In one alternative embodiment illustrated in FIG. 6B and FIG. 6C, the assembly is connected to the packaging support SP through the second face S2 of the integration structure SI. In this alternative embodiment, the control chip PC is connected by its first face to the second face of the integration structure SI and is electrically connected by its second face to the packaging support SP. In one embodiment, the mechanical connection between the packaging support SP and the control chip PC is provided by a thermal glue CTH enabling the heat generated by the control chip PC to be discharged directly to the packaging support SP.

In one embodiment illustrated in FIG. 6C, the integration structure SI includes passive elements PASS, the passive elements PASS being located outside the thermal cage formed by the non-superconducting conductive connections (comprising the conductive tracks PC and the conductive vias VC) of the assembly AS according to the invention. In one embodiment, the passive elements are selected from a (in an embodiment superconducting) inductor, a (in an embodiment superconducting) capacitor, a (in an embodiment superconducting) resonator and a (in an embodiment non-superconducting conductive) resistor. In one embodiment, the passive elements are formed in one or more routing levels at the first face S1 and/or the second face S2 of the integration structure SI, using one or more, in an embodiment superconducting, routing tracks for the inductor(s), capacitor(s) and/or resonator(s). In one embodiment, at least part of these passive elements PASS is connected by a superconducting link to the functional chip PF and/or the control chip PC. In one embodiment, at least part of these passive elements PASS is connected by a non-superconducting conductive link to the packaging support SP. In one embodiment the inductor(s) and/or capacitor(s) and/or resonator(s) are electrically connected, using one or more, in an embodiment superconducting, routing tracks, to the control chip PC and/or to the functional chip PF. In one embodiment, the resistor(s) are electrically connected by a non-superconducting conductive link to the packaging support SP.

The invention claimed is:

1. An integration structure for connecting a plurality of semiconductor devices, the integration structure comprising a substrate, a first face and a second face for receiving the semiconductor devices, the integration structure comprising:

- at the first face, at least one routing level, the at least one routing level at the first face comprising:
  - at least one non-superconducting conductive routing track of a non-superconducting conductive material; and
  - at least one superconducting routing track of a superconducting material;
- at the second face, at least one routing level, the at least one routing level at the second face comprising:
  - at least one non-superconducting conductive routing track of a non-superconducting conductive material; and
  - at least one superconducting routing track of a superconducting material;
- at least one non-superconducting conductive via connecting a non-superconducting conductive routing track of the first face to a non-superconducting routing track of the second face and/or at least one superconducting via connecting a superconducting routing track of the first face to a superconducting track of the second face.

2. The integration structure according to claim 1, comprising a plurality of routing levels at the first face and/or the second face, the routing levels of the plurality of routing levels being connected, between routing tracks of a same type, by inter-level vias of a same type.

3. The integration structure according to claim 2, wherein the routing level closest to the first face and/or the second face only comprises one or more superconducting routing tracks.

4. The integration structure according to claim 1, comprising, on the first face and/or on the second face, at least one passive component.

5. A method for manufacturing an integration structure for connecting a plurality of semiconductor devices, the integration structure comprising a substrate comprising a first face and a second face for receiving the semiconductor devices, the method comprising:

- forming, in the substrate, at least one non-superconducting conductive non-through via and at least one superconducting non-through via, the at least one non-superconducting conductive and at least one superconducting non-through vias comprising an end exposed at the first face;
- forming at least one routing level at the first face, the at least one routing level at the first face comprising at least one non-superconducting conductive track connected to a non-superconducting conductive via and at least one superconducting track connected to a superconducting via;
- temporarily bonding the substrate to a manipulating handle at its first face;
- thinning the substrate at the second face so as to expose the at least one non-superconducting conductive via and the at least one superconducting via making the at least one non-superconducting conductive via and the at least one superconducting via through vias;
- forming at least one routing level at the second face, the at least one routing level at the second face comprising at least one non-superconducting conductive track connected to the non-superconducting conductive via and at least one superconducting track connected to the superconducting via, and
- removing the manipulating handle.

6. The method according to claim 5, wherein the forming, in the substrate, at least one non-superconducting conductive non-through via and at least one superconducting non-through via comprises:

- forming, in the substrate, at least one non-superconducting conductive non-through via, the at least one non-superconducting conductive non-through via comprising an end exposed at the first face, and
- forming, in the substrate, at least one superconducting non-through via, the at least one superconducting non-through via comprising an end exposed at the first face.

7. The method according to claim 5, wherein, in the forming at least one non-superconducting conductive non-through via and at least one superconducting non-through via, both non-through vias are formed simultaneously.

8. A method for manufacturing an integration structure for connecting a plurality of semiconductor devices, the integration structure comprising a substrate comprising a first face and a second face for receiving the semiconductor devices, the method comprising:

- forming, in the substrate, at least one superconducting non-through via or at least one non-superconducting conductive non-through via, the least one superconducting non-through or at least one non-superconducting conductive non-through via comprising an end exposed at the first face;
- forming at least one routing level at the first face, the at least one routing level at the first face comprising at least one non-superconducting conductive track connected to a conductive via when such a conductive via has been formed in the previous forming step and at least one superconducting track connected to a superconducting via when such a superconducting via has been formed in the previous forming step;

temporarily bonding the substrate to a manipulating handle at its first face;

thinning the substrate at the second face so as to expose the at least one non-superconducting conductive through via or the at least one superconducting through via formed in the forming step; and forming, in the substrate at the second face, at least one non-superconducting conductive through via when at least one superconducting via has been previously formed or at least one superconducting through via when at least one non-superconducting conductive via has been previously formed, the at least one superconducting or at least one non-superconducting conductive via comprising an end at the first face in contact with at least one track of the same type of the first face, and an end exposed at the second face;

forming at least one routing level at the second face, the at least one routing level at the second face comprising at least one non-superconducting conductive track connected to the non-superconducting conductive via and at least one superconducting track connected to the superconducting via, and removing the manipulating handle.

9. The method according to claim 5, further comprising, after the forming at least one routing level at the first face:

forming, at the first face, conductive under-bump metallisations at least at part of the conductive tracks and superconducting under-bump metallisations at least at part of the superconducting tracks, and forming bumps of a type selected from superconducting bumps and non-superconducting conductive bumps, the bumps of a given type being formed at the under-bump metallisations of the same type at the first face.

10. The method according to claim 5, further comprising, after the forming at least one routing level at the second face:

forming, at the second face, conductive under-bump metallisations at least at part of the conductive tracks and superconducting under-bump metallisations at least at part of the superconducting tracks, and forming bumps of a type selected from superconducting bumps and non-superconducting conductive bumps, the bumps of a given type being formed at the under-bump metallisations of the same type at the second face.

11. An assembly comprising an integration structure according to claim 1, a first semiconductor device, forming a functional chip, and a second semiconductor device, forming a control chip, the functional chip being connected to the integration structure at the first face and the control chip being connected to the integration structure at the second face.

12. A system comprising a packaging support and an assembly according to claim 11 electrically connected to the packaging support.

13. The system according to claim 12, wherein the control chip comprises a first face and a second face and wherein the assembly is thermally connected to the packaging support through the second face of the control chip, said control chip being electrically connected by its first face to the second face of the integration structure.

14. The system according to claim 12, wherein the assembly is electrically connected to the packaging support through the second face of the integration structure.

15. The system according to claim 12, further comprising an integration structure and wherein the passive components comprise an inductor and/or a capacitor and/or a resonator and/or a resistor, said inductor and/or capacitor and/or resonator being electrically connected, using one or more routing tracks to the control chip and/or the functional chip, and said resistor being connected by a non-superconducting conductive link to the packaging support.

* * * * *